US012796413B2

(12) United States Patent
Lin

(10) Patent No.: US 12,796,413 B2
(45) Date of Patent: *Nov. 10, 2026

(54) METHOD OF MANUFACTURING MEMORY DEVICE USING SELF-ALIGNED DOUBLE PATTERNING (SADP)

(71) Applicant: NANYA TECHNOLOGY CORPORATION, New Taipei City (TW)

(72) Inventor: Chih-Ching Lin, Taoyuan City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 739 days.

This patent is subject to a terminal disclaimer.

(21) Appl. No.: 18/223,168

(22) Filed: Jul. 18, 2023

(65) Prior Publication Data

US 2024/0136186 A1 Apr. 25, 2024
US 2024/0234145 A9 Jul. 11, 2024

Related U.S. Application Data

(62) Division of application No. 17/969,558, filed on Oct. 19, 2022.

(51) Int. Cl.
*H10P 76/40* (2026.01)

(52) U.S. Cl.
CPC ........ *H10P 76/4088* (2026.01); *H10P 76/405* (2026.01); *H10P 76/4083* (2026.01); *H10P 76/4085* (2026.01)

(58) Field of Classification Search
CPC ............... H10P 76/4088; H10P 76/405; H10P 76/4083; H10P 76/4085; H10P 76/2043;
(Continued)

(56) References Cited

U.S. PATENT DOCUMENTS 11,557,661 B2 1/2023 Yatsuda
2008/0054344 A1* 3/2008 Nam ...................... H10B 41/30
257/E21.422

(Continued)

OTHER PUBLICATIONS

Office Action and and the search report mailed on Feb. 12, 2026 related to U.S. Appl. No. 17/969,558, wherein this application is a DIV of U.S. Appl. No. 17/969,558.

*Primary Examiner* — William B Partridge
*Assistant Examiner* — Linda J. Fleck
(74) *Attorney, Agent, or Firm* — Xuan Zhang

(57) ABSTRACT

The present application provides a memory device and a method of manufacturing the memory device. The method includes steps of providing a semiconductor substrate defined with an active area disposed over or in the semiconductor substrate; forming a first hard mask over the semiconductor substrate; forming a core over the first hard mask, wherein the core has a strip portion and a protruding portion protruding laterally from the strip portion; forming a spacer surrounding the core; removing the strip portion of the core; removing portions of the first hard mask exposed through the spacer and the protruding portion of the core; forming a second hard mask surrounding the first hard mask; removing the first hard mask; and removing portions of the semiconductor substrate exposed through the second hard mask to form a trench surrounding the active area.

15 Claims, 43 Drawing Sheets

(58) Field of Classification Search
CPC ....... H10P 50/695; H10P 50/71; H10B 12/09; H10W 20/071; H10W 20/031
See application file for complete search history.

(56) References Cited

U.S. PATENT DOCUMENTS

| | | | | |
|---|---|---|---|---|
| 2017/0170272 | A1 | 6/2017 | Brink et al. | |
| 2018/0204731 | A1* | 7/2018 | Zhang | H10P 30/40 |
| 2019/0067008 | A1* | 2/2019 | Chen | H10P 50/695 |
| 2019/0096692 | A1* | 3/2019 | Bei | H10P 14/683 |
| 2019/0237341 | A1 | 8/2019 | Yu et al. | |
| 2023/0068794 | A1* | 3/2023 | Lin | H10B 10/12 |
| 2023/0238238 | A1* | 7/2023 | Singhal | H10P 14/6336 257/288 |
| 2023/0284444 | A1* | 9/2023 | Chou | H10B 41/46 257/253 |

* cited by examiner

METHOD OF MANUFACTURING MEMORY DEVICE USING SELF-ALIGNED DOUBLE PATTERNING (SADP)

CROSS-REFERENCE TO RELATED APPLICATION

This application is a divisional application of U.S. Non-Provisional application Ser. No. 17/969,558 filed 19 Oct. 2022, which is incorporated herein by reference in its entirety.

TECHNICAL FIELD

The present disclosure relates to a memory device and a manufacturing method thereof, and more particularly, to a method of manufacturing a memory device defined with an active area (AA) using a self-aligned double patterning (SADP) process.

DISCUSSION OF THE BACKGROUND

Memory devices are used in a variety of electronic applications, such as personal computers, cellular phones, digital cameras, and other electronic equipment. The memory devices are typically fabricated by sequentially depositing insulating or dielectric layers, conductive layers, and semiconductive layers of material over a semiconductor substrate, and patterning the various material layers using lithography to form circuit components and elements thereon.

As the semiconductor industry has progressed into advanced technology process nodes in pursuit of greater device density, higher performance, and lower costs, challenges of precise control of lithography have arisen. Such advancement presents an obstacle to increase routing density of the memory device. The increase of density may induce a narrower process window and may result in misalignment or leakage among the memory cells in the memory device, and therefore limits reduction of minimum feature size. It is therefore desirable to develop improvements that address related manufacturing challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a memory device. The method includes steps of providing a semiconductor substrate defined with an active area disposed over or in the semiconductor substrate; forming a first hard mask over the semiconductor substrate; forming a core over the first hard mask, wherein the core has a strip portion and a protruding portion laterally protruding from the strip portion; forming a spacer surrounding the core; removing the strip portion of the core; removing portions of the first hard mask exposed through the spacer and the protruding portion of the core; forming a second hard mask surrounding the first hard mask; removing the first hard mask; and removing portions of the semiconductor substrate exposed through the second hard mask to form a trench surrounding the active area.

In some embodiments, the method further comprises filling the trench with dielectric materials to form a shallow trench isolation (STI) surrounding the active area.

In some embodiments, the protruding portion of the core protrudes laterally toward the spacer.

In some embodiments, the protruding portion of the core has a semi-circular cylindrical shape.

In some embodiments, the formation of the spacer includes disposing a spacer material over the first hard mask and covering the core, and then planarizing the spacer material to expose at least a portion of the core through the spacer material.

In some embodiments, after the removal of the strip portion of the core, a first slot surrounded by the spacer is formed.

In some embodiments, after the removal of the strip portion of the core, the protruding portion of the core is surrounded by the spacer.

In some embodiments, after the formation of the spacer, the spacer has a recess laterally indented into the spacer.

In some embodiments, the recess is complementary with the protruding portion of the core.

In some embodiments, after the removal of the portions of the first hard mask, a second slot surrounded by residual portions of the first hard mask is formed.

In some embodiments, the second slot corresponds to a first slot surrounded by the spacer and formed after the removal of the strip portion of the core.

In some embodiments, a first etch rate of the first hard mask relative to an etchant is substantially different from a second etch rate of the second hard mask relative to the etchant.

In some embodiments, the second hard mask includes oxide or carbon.

Another aspect of the present disclosure provides a method of manufacturing a memory device. The method includes steps of providing a semiconductor substrate defined with an active area disposed over or in the semiconductor substrate; forming a first hard mask over the semiconductor substrate, wherein the first hard mask includes a plurality of slots; forming a second hard mask surrounding the first hard mask and disposed within the plurality of slots, wherein the second hard mask includes a plurality of strips extending parallel to each other; removing the first hard mask; and removing portions of the semiconductor substrate exposed through the second hard mask to form a plurality of trenches surrounding the active area.

In some embodiments, the plurality of strips are separated from each other.

In some embodiments, the plurality of slots respectively correspond to the plurality of strips.

In some embodiments, the first hard mask includes carbon, and the second hard mask includes oxide.

In some embodiments, the first hard mask includes oxide, and the second hard mask includes carbon.

In some embodiments, a plurality of fins protruding from the semiconductor substrate are formed after the formation of the plurality of trenches.

In some embodiments, the plurality of fins are separated from each other.

Another aspect of the present disclosure provides a method of manufacturing a memory device. The method includes steps of providing a semiconductor substrate defined with an active area disposed over or in the semiconductor substrate; forming a first hard mask over the semiconductor substrate; forming a core over the first hard mask, wherein the core has a plurality of first strip portions and a plurality of protruding portions, wherein each protruding portion laterally protrudes from a corresponding one of the plurality of first strip portions; forming a spacer surrounding the core, wherein the spacer includes a first bridging portion extending laterally between two of the plurality of protruding portions; removing the plurality of first strip portions of the core; removing portions of the first hard mask exposed through the spacer and the plurality of protruding portions of the core; forming a second hard mask surrounding the first hard mask; removing the first hard mask; and removing portions of the semiconductor substrate exposed through the second hard mask to form a trench surrounding the active area.

In some embodiments, the first bridging portion of the spacer is disposed between two of the plurality of first strip portions of the core.

In some embodiments, after the formation of the spacer, the spacer has a recess laterally indented into the first bridging portion of the spacer.

In some embodiments, the first bridging portion of the spacer is conformal to the recess of the spacer.

In some embodiments, the second hard mask is formed by disposing a second hard mask material over the first hard mask, and planarizing the second hard mask material to expose the first hard mask.

In some embodiments, after the removal of portions of the first hard mask exposed through the spacer and the plurality of protruding portions of the core, the first hard mask includes a second bridging portion extending laterally between two of a plurality of second strip portions of the first hard mask.

In some embodiments, a width of the first bridging portion is substantially less than a width of the second bridging portion.

In some embodiments, a first etch rate of the first hard mask relative to an etchant is substantially different from a second etch rate of the second hard mask relative to the etchant.

In some embodiments, a first etch rate of the first hard mask relative to an etchant is substantially greater than a second etch rate of the second hard mask relative to the etchant.

In some embodiments, a first etch rate of the first hard mask relative to an etchant is substantially less than a second etch rate of the second hard mask relative to the etchant.

In some embodiments, the second hard mask includes a plurality of strips separated from each other.

In some embodiments, the plurality of strips are parallel to each other.

In some embodiments, the plurality of strips have a same length.

In some embodiments, the core includes photoresist material.

In some embodiments, the spacer includes nitride.

In conclusion, because an active area over or in a memory device can be defined by disposing an additional hard mask pattern instead of partially removing or modifying another hard mask pattern, a total number of photomasks required for defining the active area can be reduced. Therefore, misalignment among memory cells in the memory device can be prevented or minimized. As a result, an overall performance of the memory device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
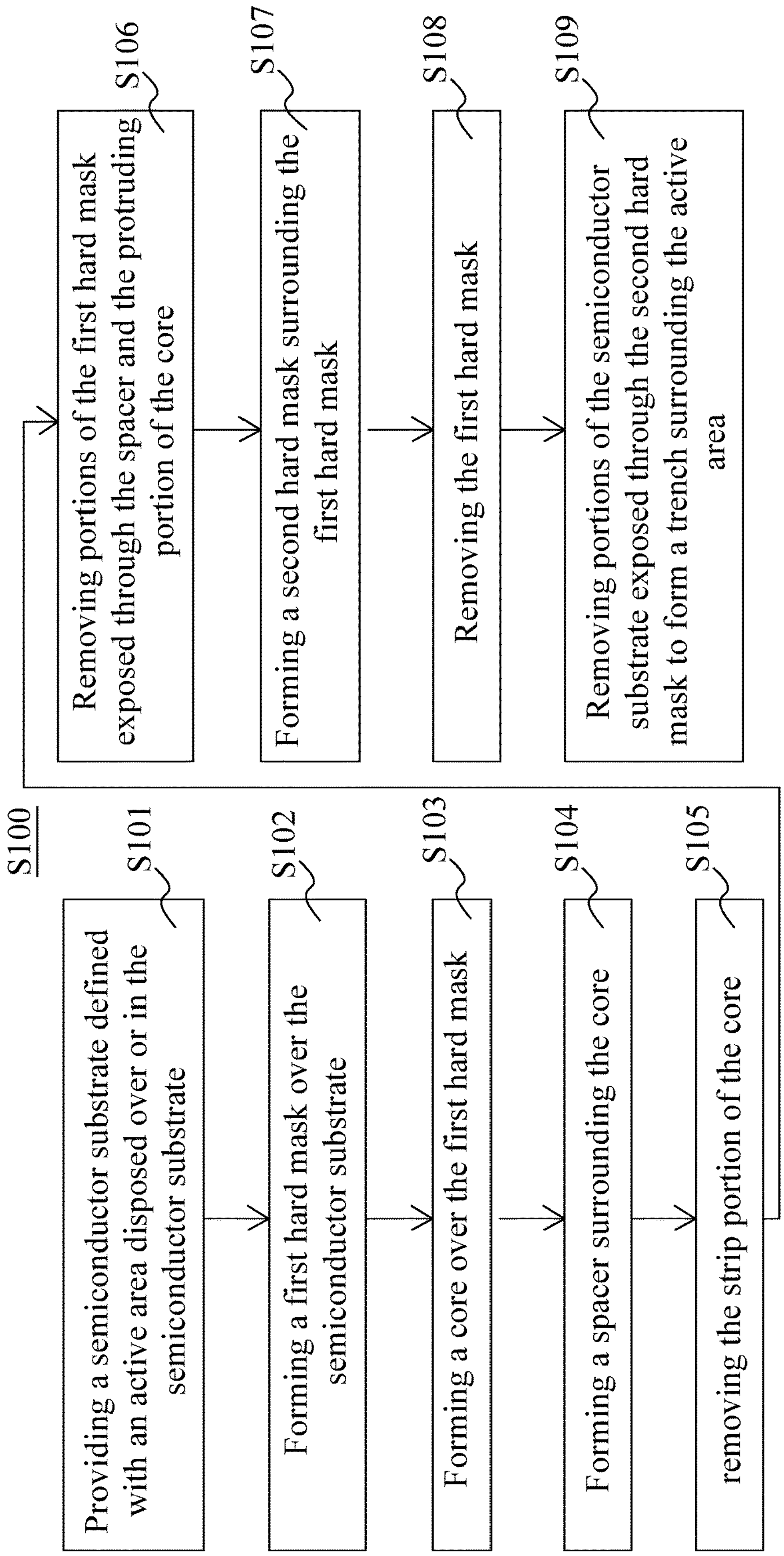
FIG. 1 is a flow diagram illustrating a method of manufacturing a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method S100 of manufacturing a memory device in accordance with some embodiments of the present disclosure, and FIGS. 2 to 43 are cross-sectional views of intermediate stages in formation of the memory device in accordance with some embodiments of the present disclosure.

The stages shown in FIGS. 2 to 43 are also illustrated schematically in the flow diagram in FIG. 1. In following discussion, the fabrication stages shown in FIGS. 2 to 43 are discussed in reference to process steps shown in FIG. 1. The method S100 includes a number of operations, and description and illustration are not deemed as a limitation to a sequence of the operations. The method S100 includes a number of steps (S101, S102, S103, S104, S105, S106, S107, S108 and S109).

In some embodiments, the method S100 includes providing a semiconductor substrate defined with an active area disposed over or in the semiconductor substrate (S101); forming a first hard mask over the semiconductor substrate (S102); forming a core over the first hard mask, wherein the core has a strip portion and a protruding portion laterally protruding from the strip portion (S103); forming a spacer surrounding the core (S104); removing the strip portion of the core (S105); removing portions of the first hard mask exposed through the spacer and the protruding portion of the core (S106); forming a second hard mask surrounding the first hard mask (S107); removing the first hard mask (S108); and removing portions of the semiconductor substrate exposed through the second hard mask to form a trench surrounding the active area (S109).

Figure 2:
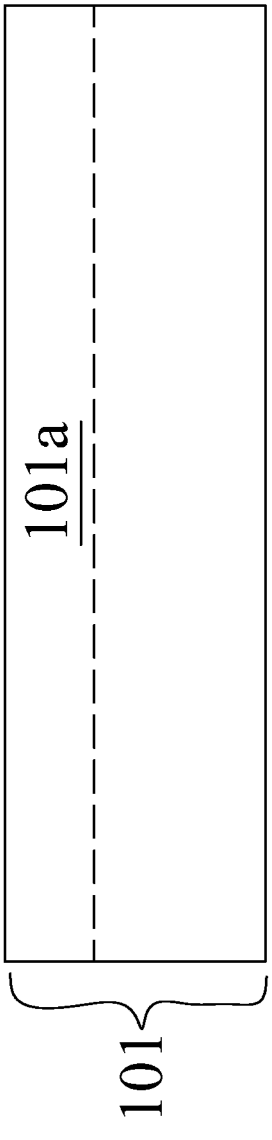
FIGS. 2 to 43 are illustrations of intermediate stages in the formation of a memory device in accordance with some embodiments of the present disclosure.

Referring to FIG. 2, a semiconductor substrate 101 is provided according to step S101 in FIG. 1. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a silicon substrate. In some embodiments, the semiconductor substrate 101 includes lightly-doped monocrystalline silicon.

In some embodiments, the semiconductor substrate 101 is defined with a peripheral region (not shown) and an array region. FIG. 2 illustrates only the array region of the semiconductor substrate 101. In some embodiments, the array region is at least partially surrounded by the peripheral region. In some embodiments, the peripheral region is adjacent to a periphery of the semiconductor substrate 101, and the array region is adjacent to a central area of the semiconductor substrate 101. In some embodiments, the array region may be subsequently used for fabricating electronic components such as capacitors, transistors or the like. In some embodiments, a boundary is disposed between the peripheral region and the array region.

In some embodiments, an active area 101*a* is defined with the semiconductor substrate 101 as shown in FIG. 2. The active area 101*a* is disposed over or in the semiconductor substrate 101. In some embodiments, the active area 101*a* is a doped region in the semiconductor substrate 101. In some embodiments, the active area 101*a* extends horizontally over or under a top surface of the semiconductor substrate 101.

Figure 3:
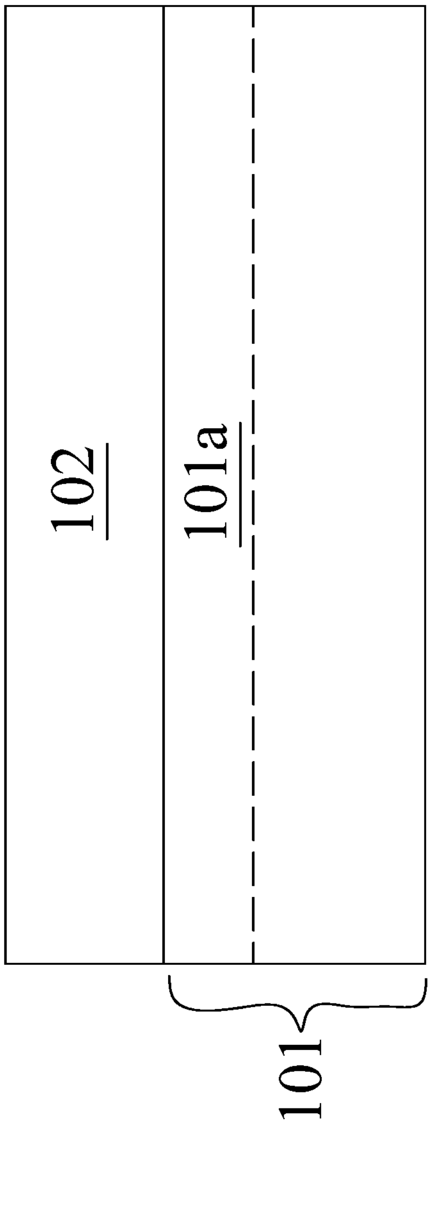

Referring to FIG. 3, a first hard mask 102 is formed over the semiconductor substrate 101 according to step S102. In some embodiments, the first hard mask 102 is disposed on the semiconductor substrate 101 by physical vapor deposition (PVD), chemical vapor deposition (CVD), spin coating or any other suitable process. In some embodiments, the first hard mask 102 includes dielectric materials such as oxide, nitride, carbide or the like. In some embodiments, the first hard mask 102 includes silicon oxide, silicon nitride, silicon carbide or the like.

Figure 4:
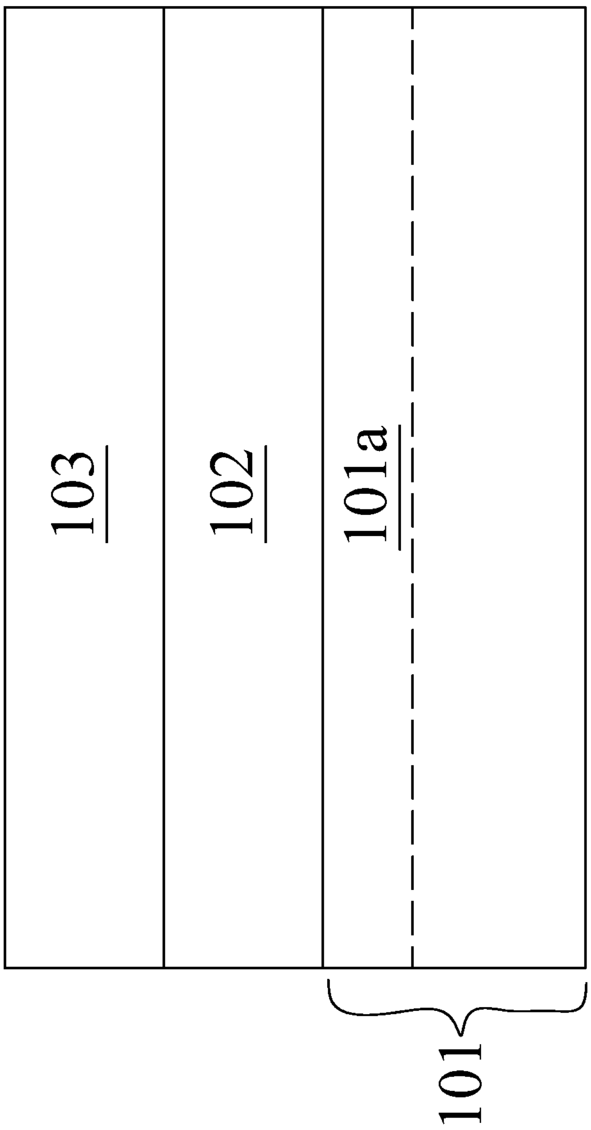

In some embodiments, an additional hard mask 103 is formed over the first hard mask 102 as shown in FIG. 4. In some embodiments, the additional hard mask 103 is disposed on the first hard mask 102 and over the semiconductor substrate 101 by physical vapor deposition (PVD), chemical vapor deposition (CVD), spin coating or any other suitable process.

In some embodiments, the additional hard mask 103 includes dielectric materials such as oxide, nitride, carbide or the like. In some embodiments, the additional hard mask 103 includes silicon oxide, silicon nitride, silicon carbide or the like. In some embodiments, the additional hard mask 103 and the first hard mask 102 have different etch selectivities. That is, the additional hard mask 103 and the first hard mask 102 have different etch rates relative to the same etchant. In some embodiments, the additional hard mask 103 and the first hard mask 102 have different materials. In some embodiments, multiple additional hard masks 103 are sequentially disposed over each other.

Figure 5:
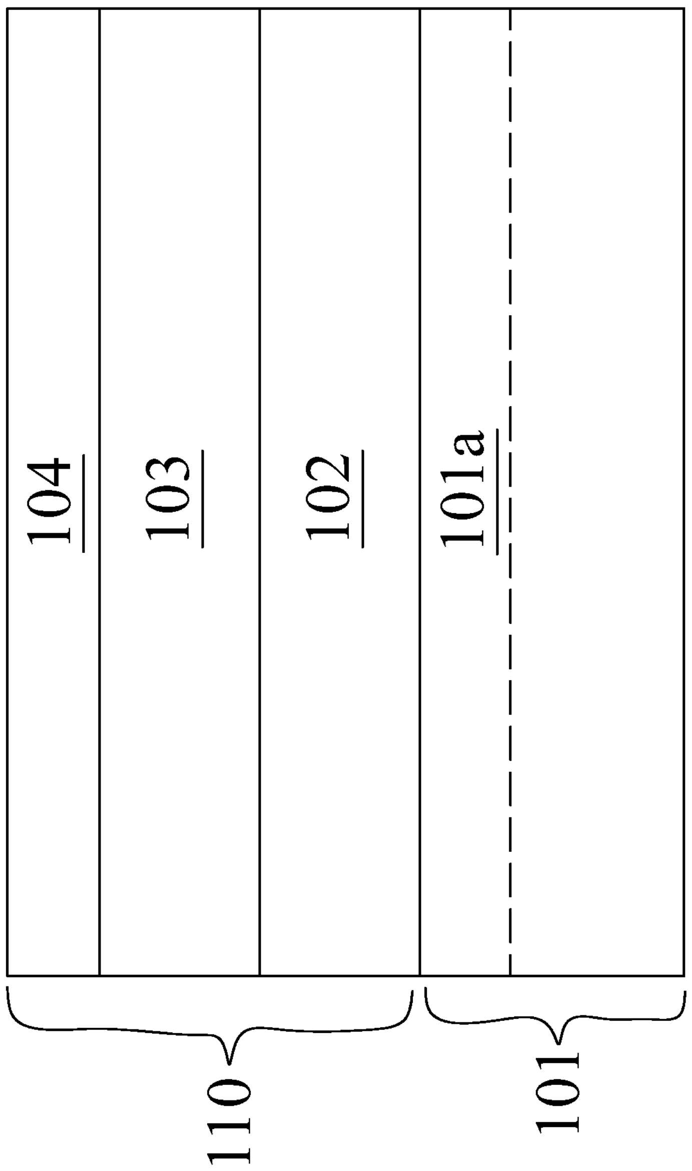

In some embodiments, an anti-reflective layer 104 is disposed over the additional hard mask 103 and the first hard mask as shown in FIG. 5. In some embodiments, the anti-reflective layer 104 is an anti-reflective coating (ARC) and includes anti-reflective material.

In some embodiments, the anti-reflective layer 104 is disposed by physical vapor deposition (PVD), chemical vapor deposition (CVD), spin coating or any other suitable process. In some embodiments, the first hard mask 102, the additional hard mask 103 and the anti-reflective layer 104 form a hard mask stack 110.

Figure 6:
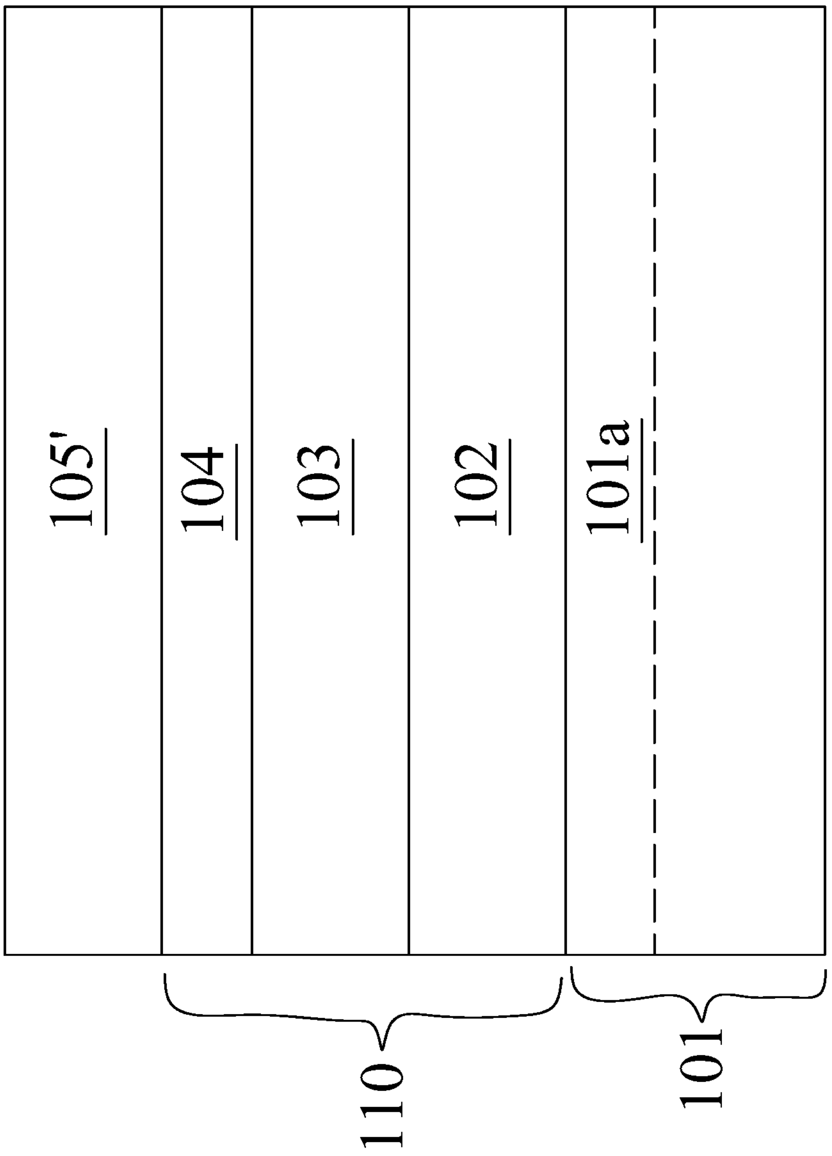

Referring to FIGS. 6 to 10, a core 105 is formed over the first hard mask 102 according to step S103 in FIG. 1. In some embodiments, the formation of the core 105 includes a step of disposing a core material 105' over the first hard mask 102 as shown in FIG. 6. In some embodiments, the core material 105' is disposed by physical vapor deposition (PVD), chemical vapor deposition (CVD), spin coating or any other suitable process.

In some embodiments, the core material 105' includes dielectric materials such as oxide, nitride, carbide or the like. In some embodiments, the core material 105' includes photoresist material. In some embodiments, the core material 105' includes silicon oxide, silicon nitride, silicon carbide or the like.

Figure 7:
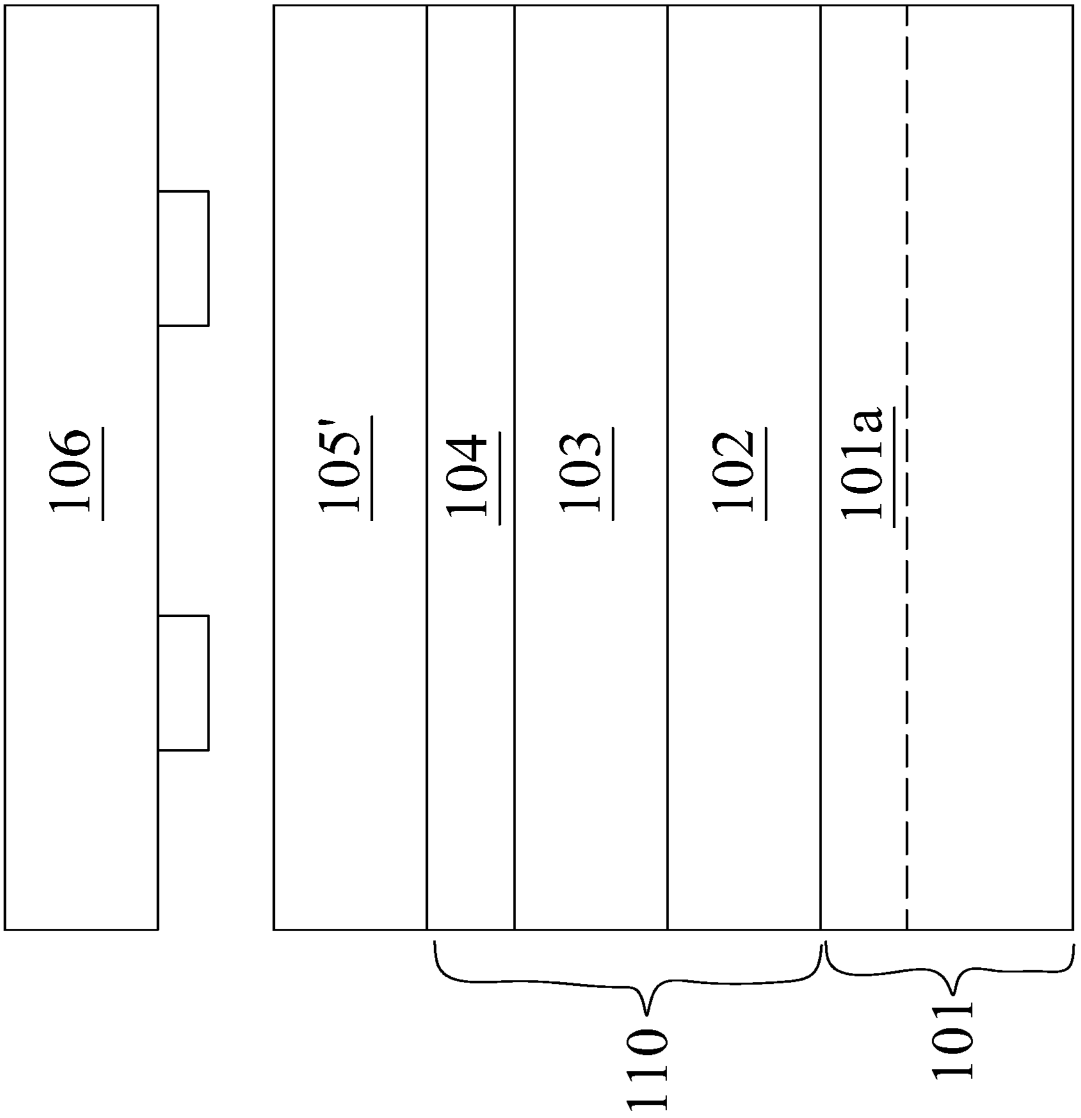

In some embodiments, after the disposing of the core material 105' as shown in FIG. 6, a mask 106 is disposed above the core material 105' as shown in FIG. 7. In some embodiments, the mask 106 includes a blocking pattern configured to block a predetermined electromagnetic radiation passing through the mask 106.

In some embodiments, the formation of the core 105 includes a step of exposing the core material 105' to the predetermined electromagnetic radiation passing through the mask 106. As such, some portions of the core material 105' are exposed to the predetermined electromagnetic radiation, while some other portions of the core material 105' are blocked from the exposure by the mask 106.

Figure 8:
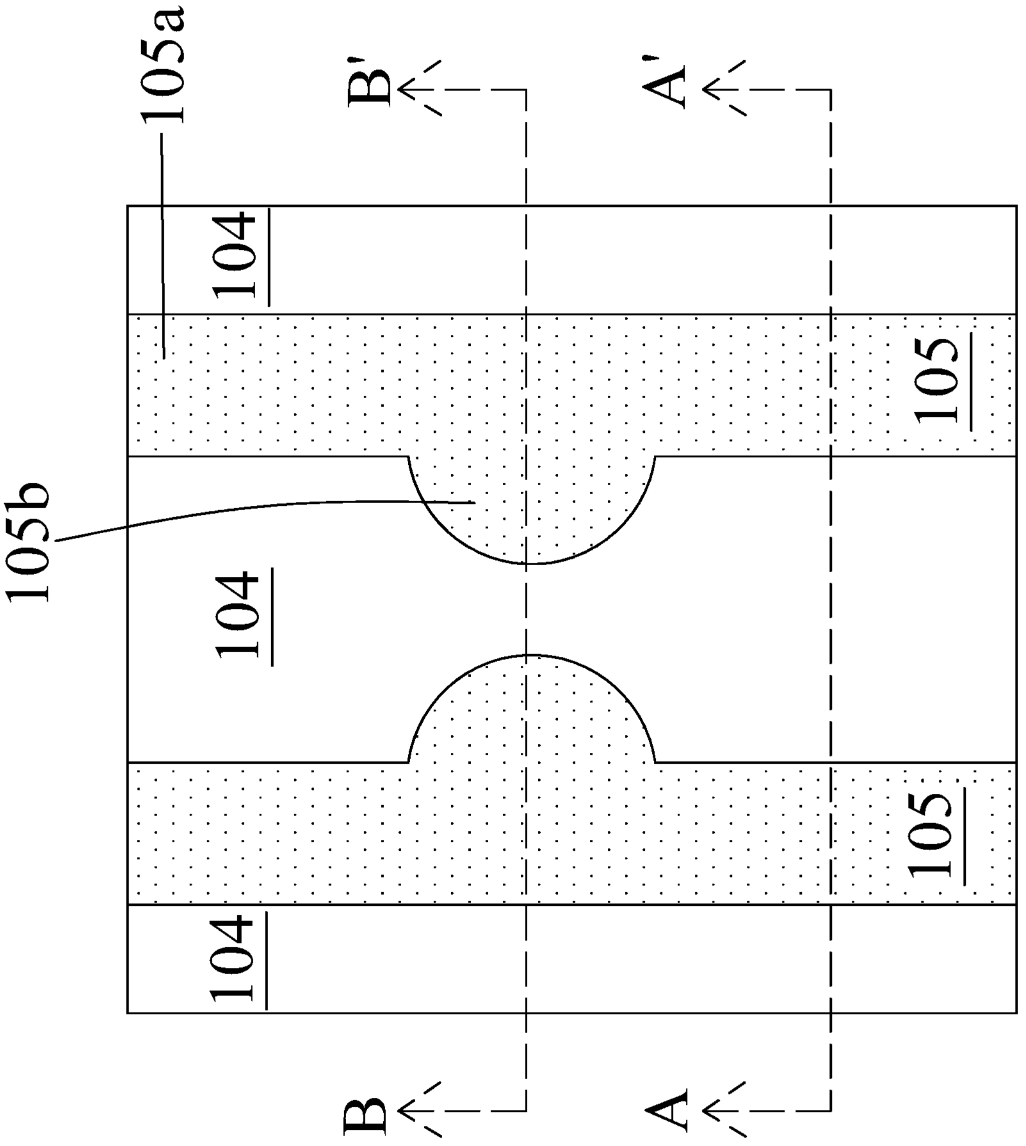
Figure 9:
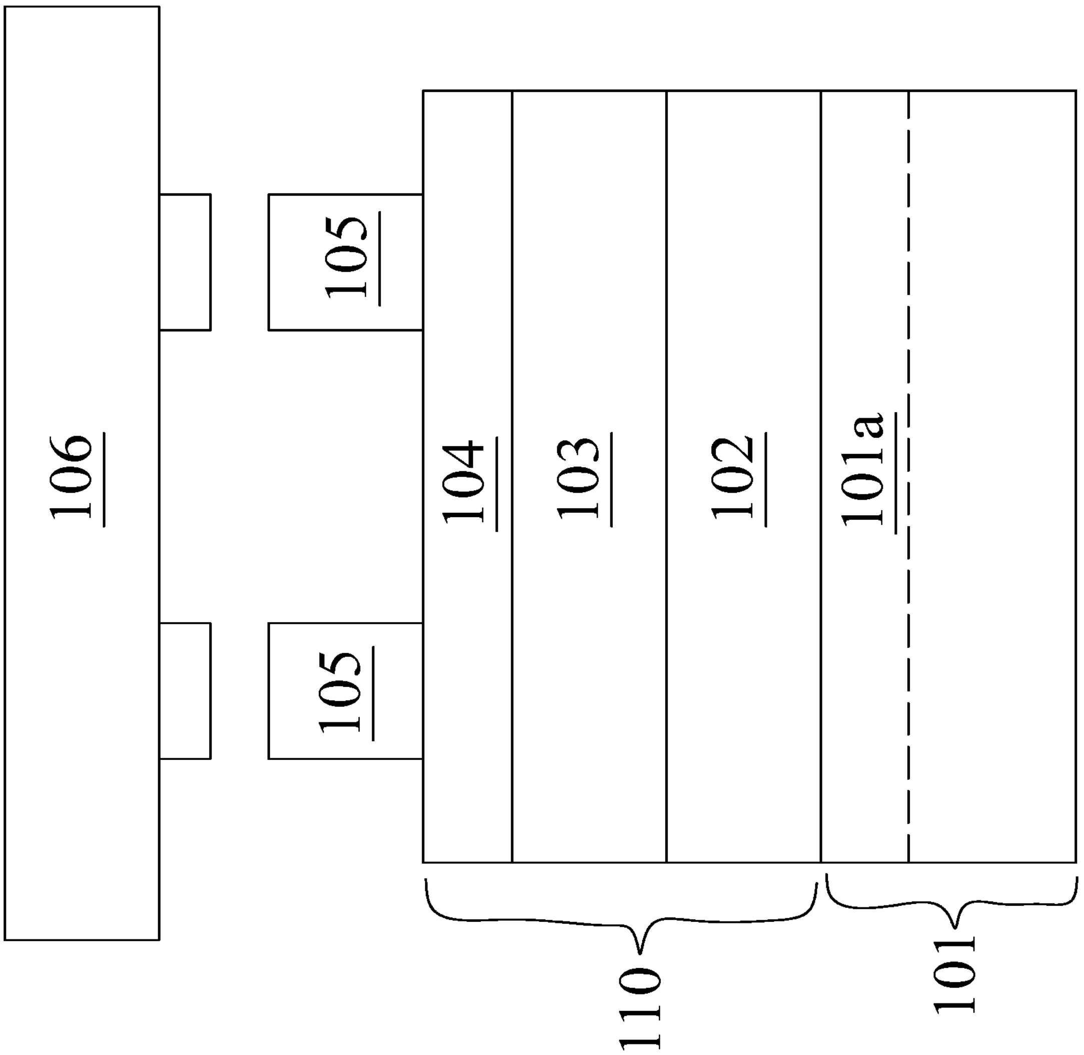
Figure 10:
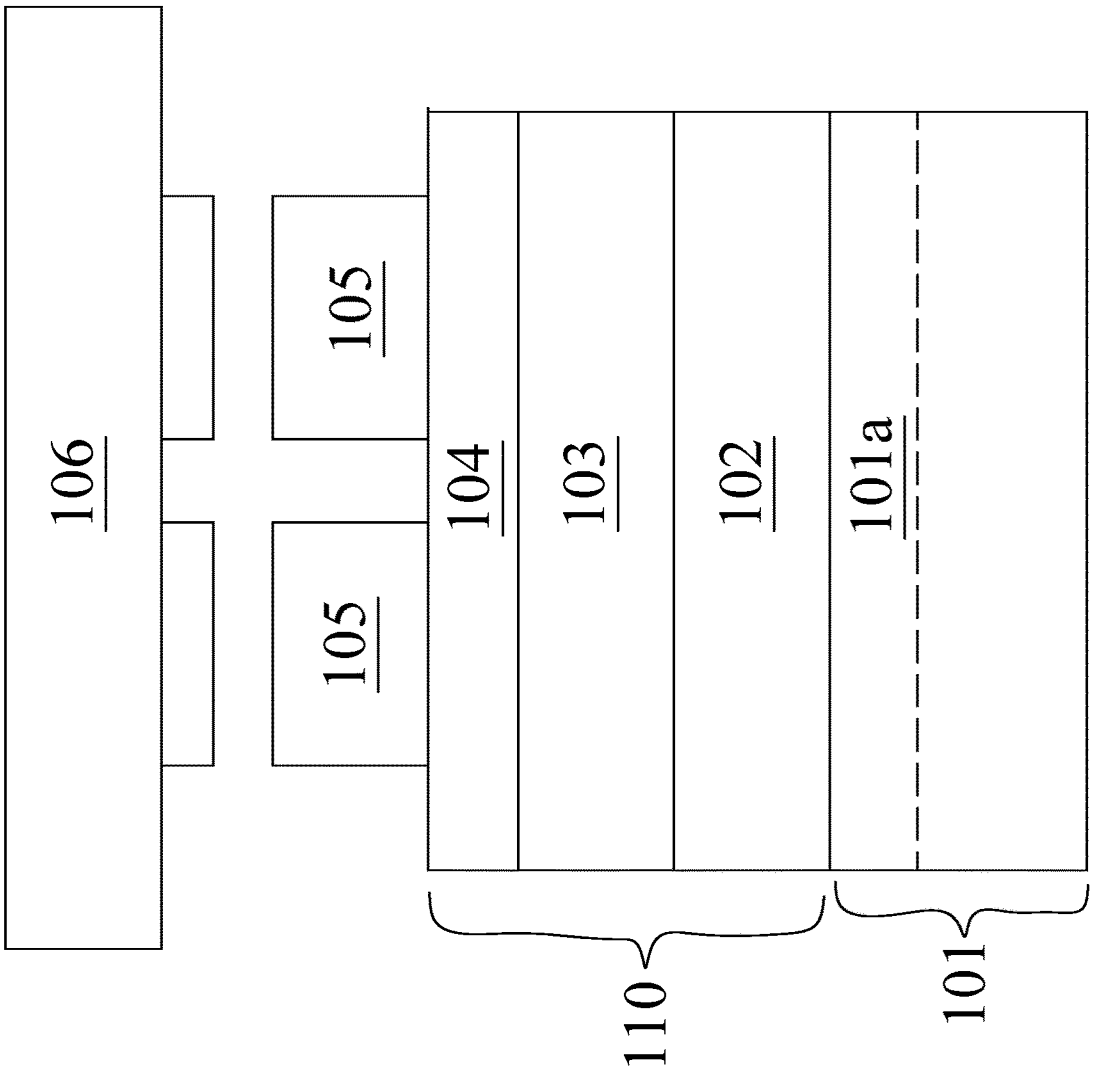

In some embodiments, after the exposure of the core material 105' to the predetermined electromagnetic radiation through the mask 106, the exposed portions of the core material 105' are removed to form the core 105 as shown in FIGS. 8 to 10.

FIG. 8 illustrates a top view of an intermediate structure after the removal of the exposed portions of the core material 105'. FIG. 9 illustrates a cross-sectional view of the intermediate structure of FIG. 8 along a line A-A'. FIG. 10 illustrates a cross-sectional view of the intermediate structure of FIG. 8 along a line B-B'. In some embodiments, the exposed portions of the core material 105' are removed by etching or any other suitable process.

In some embodiments, after the removal of the exposed portions of the core material 105', the core 105 having a strip portion 105*a* and a protruding portion 105*b* is formed as shown in FIGS. 8 to 10. The core 105 has the strip portion 105*a* and the protruding portion 105*b* laterally protruding from the strip portion 105*a*. In some embodiments, the strip portion 105*a* and the protruding portion 105*b* are integrally formed. That is, the strip portion 105*a* and the protruding portion 105*b* are coupled with each other.

Figure 11:
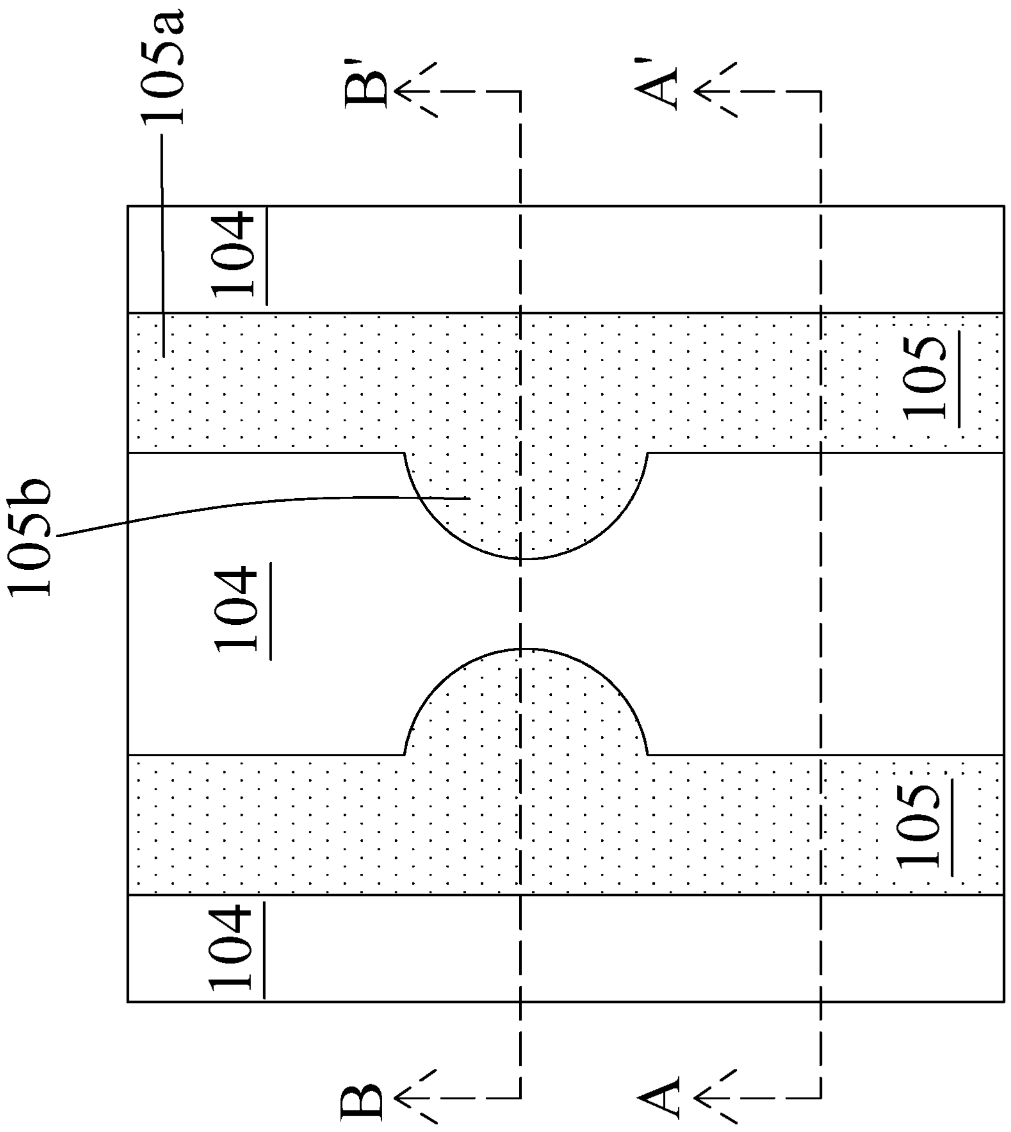
Figure 12:
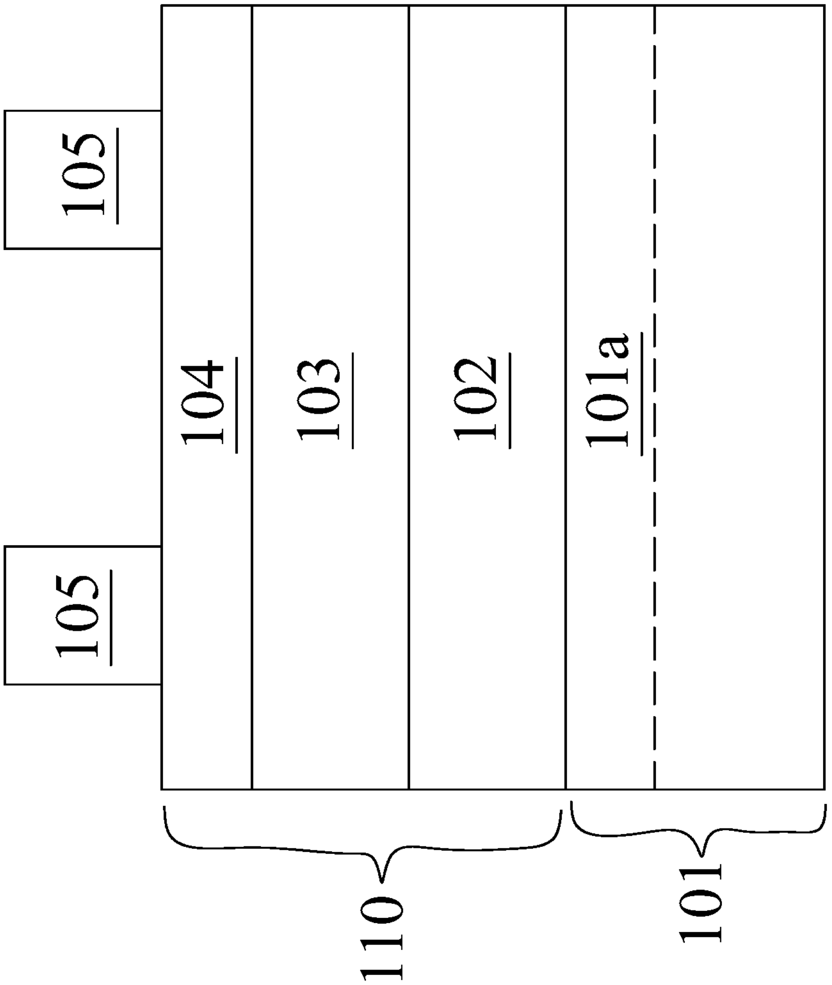
Figure 13:
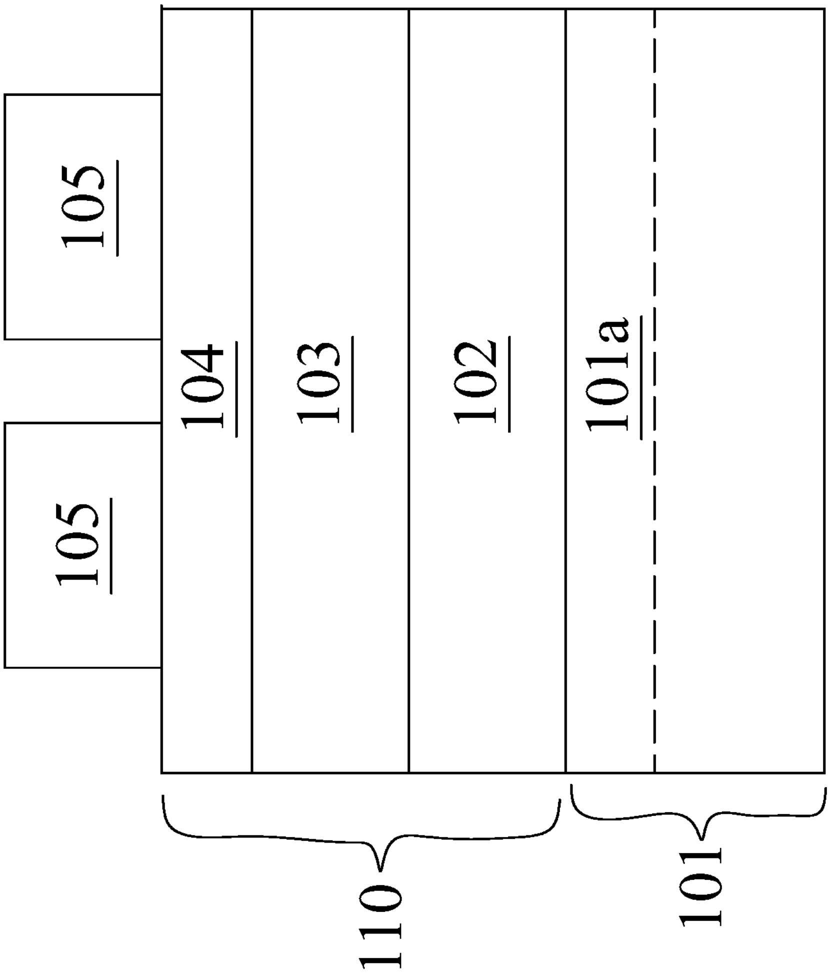

In some embodiments, the strip portion 105*a* extends vertically over the first hard mask 103 and the semiconductor substrate 101. In some embodiments, the protruding portion 105*b* has a semi-circular cylindrical shape or polygonal shape. In some embodiments, after the formation of the core 105 having the strip portion 105*a* and the protruding portion 105*b*, the mask 106 is removed as shown in FIGS. 11 to 13.

Figure 14:
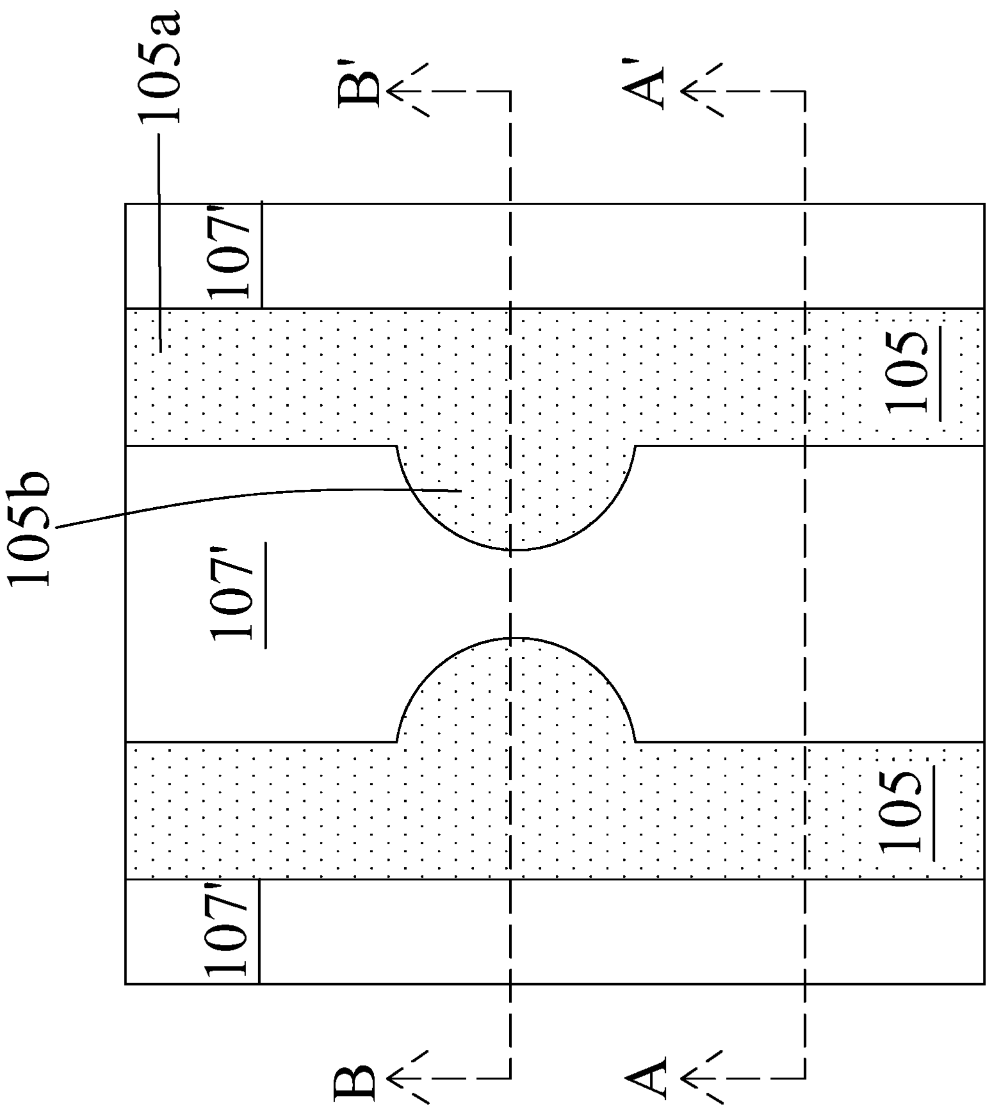
Figure 15:
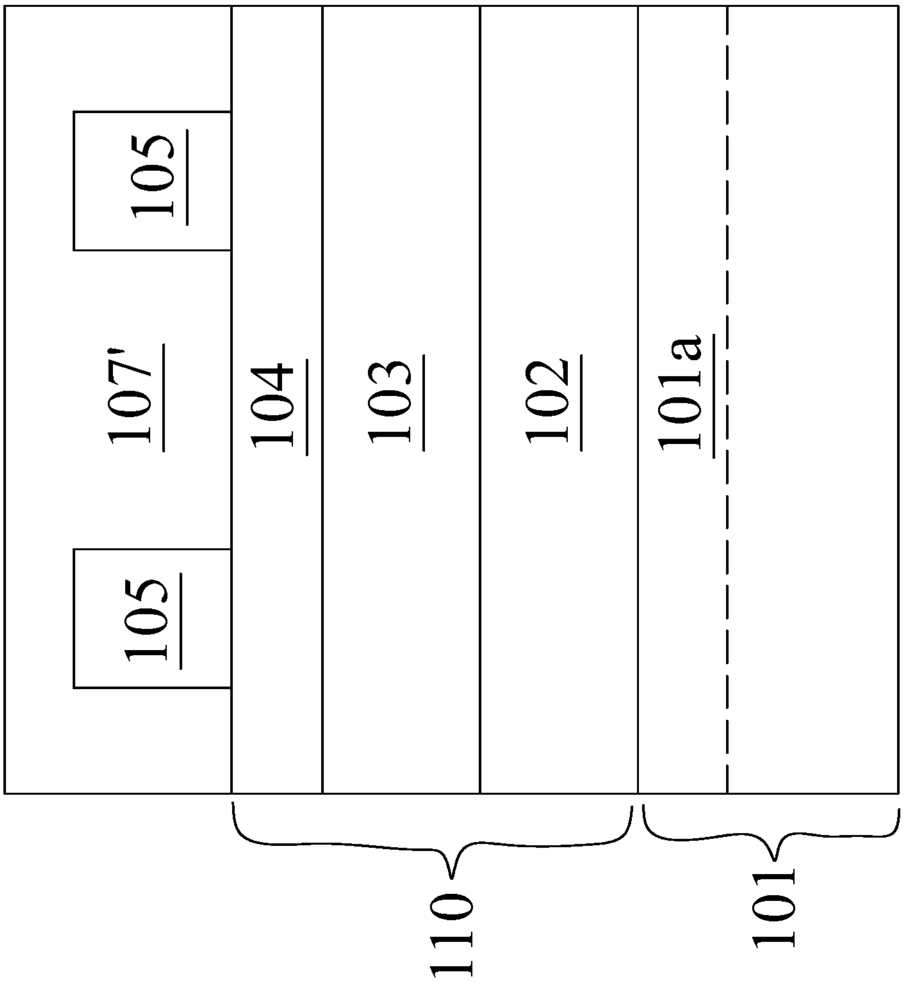
Figure 16:
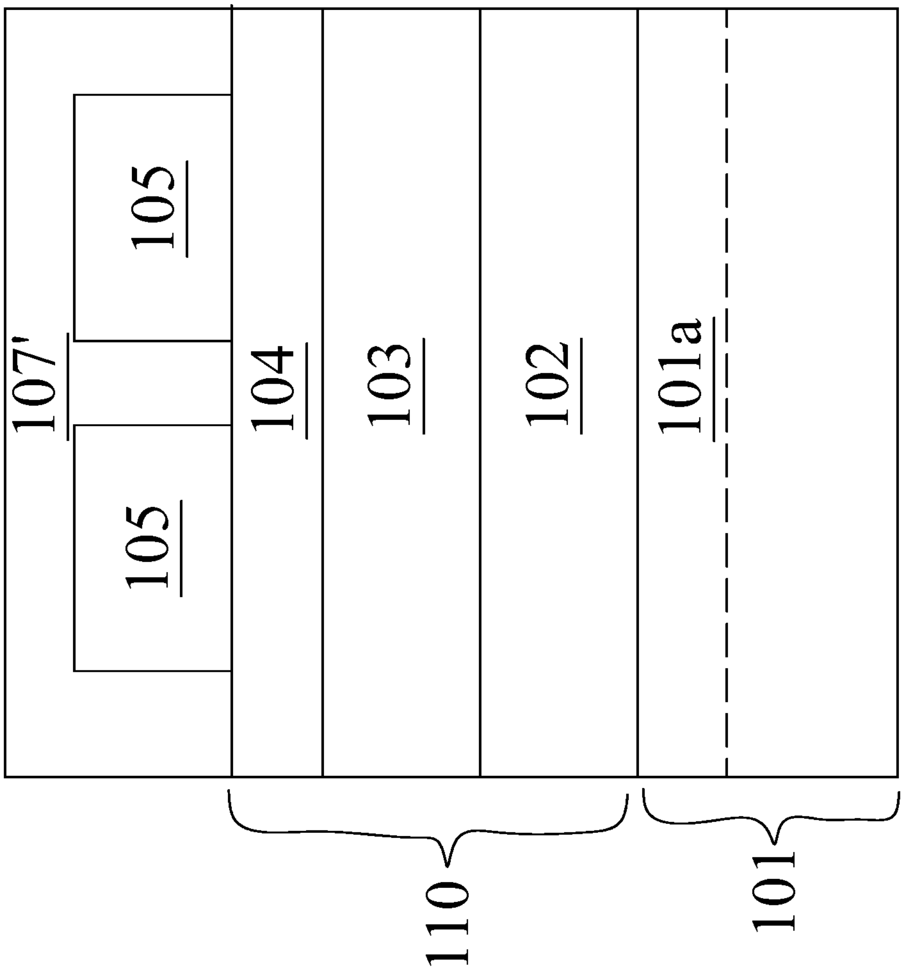

Referring to FIGS. 14 to 19, a spacer 107 is formed according to step S104 in FIG. 1. In some embodiments, the spacer 107 is formed to surround the core 105. In some embodiments, the formation of the spacer 107 includes a step of disposing a spacer material 107' over the anti-reflective layer 104 and the core 105 as shown in FIGS. 14 to 16.

FIG. 14 illustrates a top cross-sectional view of an intermediate structure after the disposing of the spacer material 107'. FIG. 15 illustrates a cross-sectional view of the intermediate structure of FIG. 14 along a line A-A'. FIG. 16 illustrates a cross-sectional view of the intermediate structure of FIG. 14 along a line B-B'.

The spacer material 107' covers the core 105. In some embodiments, the spacer material 107' is disposed by physical vapor deposition (PVD), chemical vapor deposition (CVD), spin coating or any other suitable process. In some embodiments, the spacer material 107' includes dielectric materials such as oxide, nitride, carbide or the like. In some embodiments, the spacer material 107' includes silicon oxide, silicon nitride, silicon carbide or the like.

Figure 17:
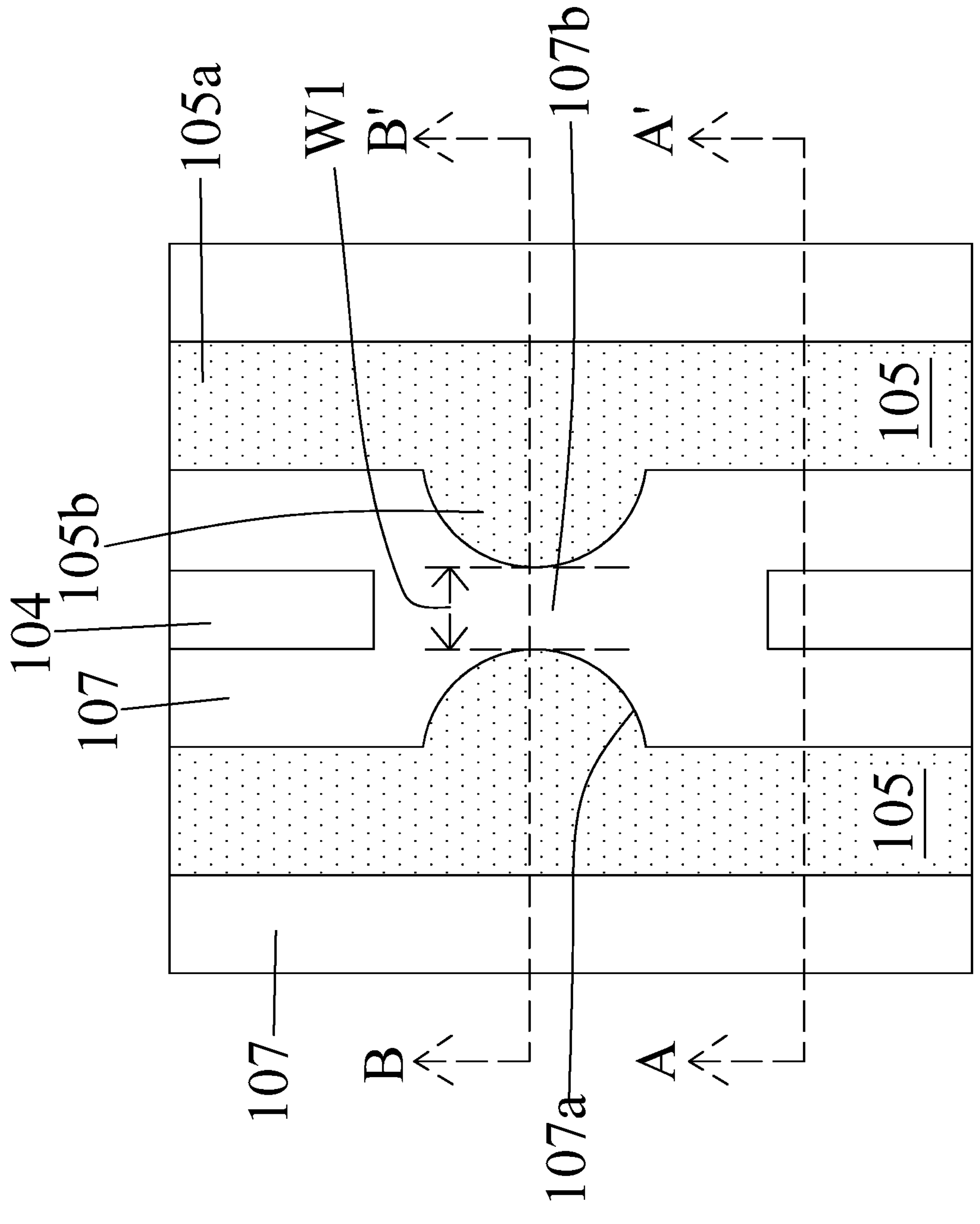
Figure 18:
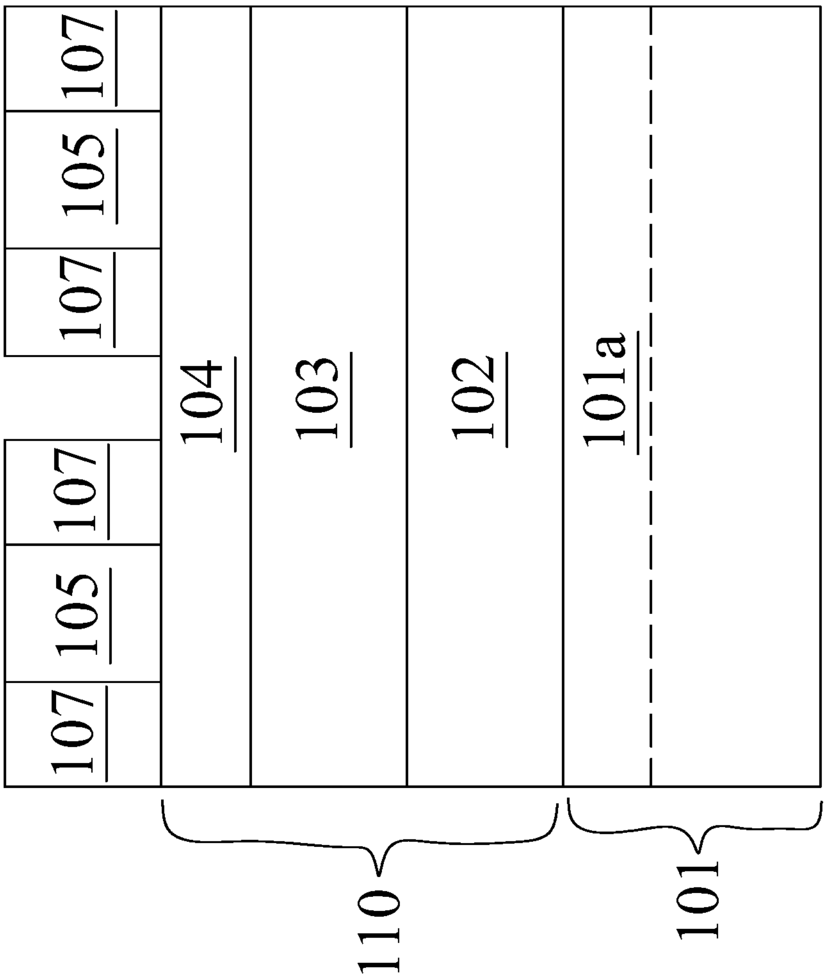
Figure 19:
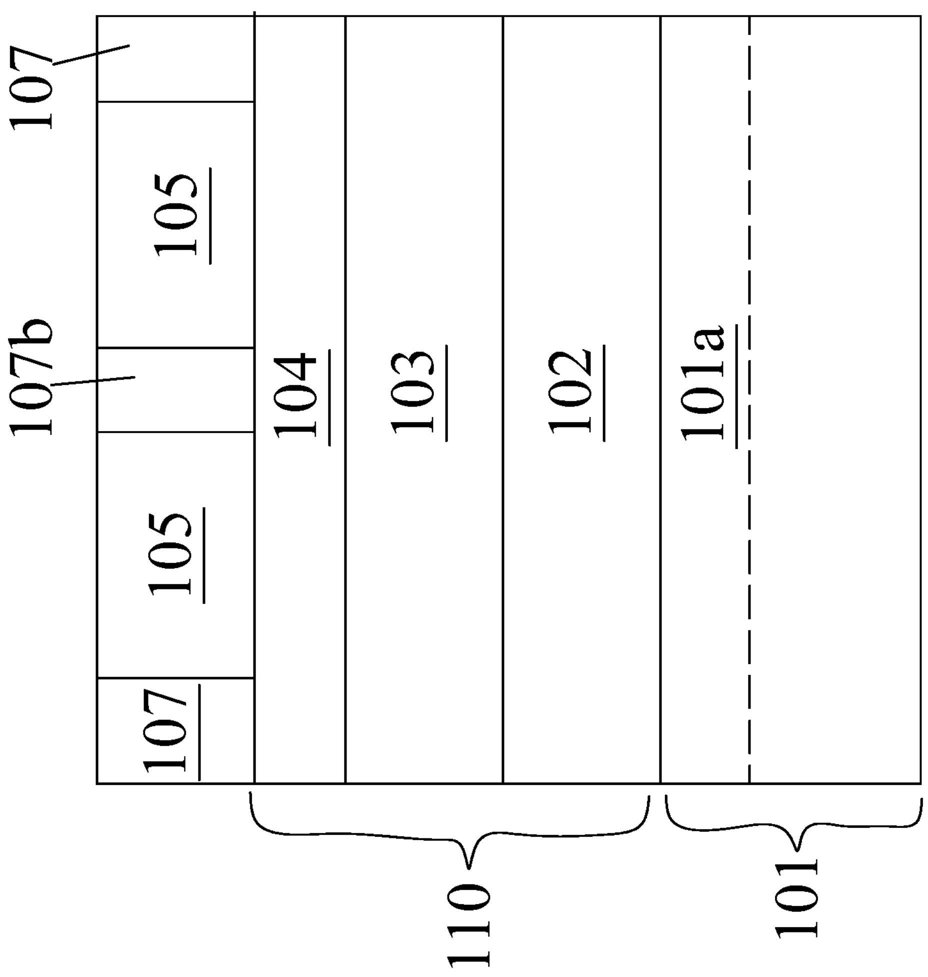

In some embodiments, the formation of the spacer 107 includes a step of planarizing the spacer material 107' after the disposing of the spacer material 107', as shown in FIGS. 17 to 19. In some embodiments, a top portion of the spacer material 107' is removed until a portion of the core 105 is exposed through the spacer material 107' as shown in FIGS. 17 to 19. In some embodiments, a portion of the spacer material 107' is removed to expose a portion of the anti-reflective layer 104 as shown in FIG. 18. In some embodiments, the protruding portion 105*b* of the core 105 protrudes laterally toward the spacer 107.

In some embodiments, after the formation of the spacer 107, the spacer 107 has a recess 107*a* laterally indented into the spacer 107 as shown in FIG. 17. In some embodiments, the recess 107*a* is complementary with the protruding portion 105*b* of the core 105. In some embodiments, the spacer 107 includes a bridging portion 107*b* extending laterally between two of the protruding portions 105*b* of the core 105 as shown in FIG. 17.

In some embodiments, the bridging portion 107*b* of the spacer 107 is disposed between two of the strip portions 105*a* of the core 105. In some embodiments, the recess 107*a* of the spacer 107 is laterally indented into the bridging portion 107*b* of the spacer 107. In some embodiments, the bridging portion 107*b* of the spacer 107 is conformal to the recess 107*a* of the spacer 107.

Figure 20:
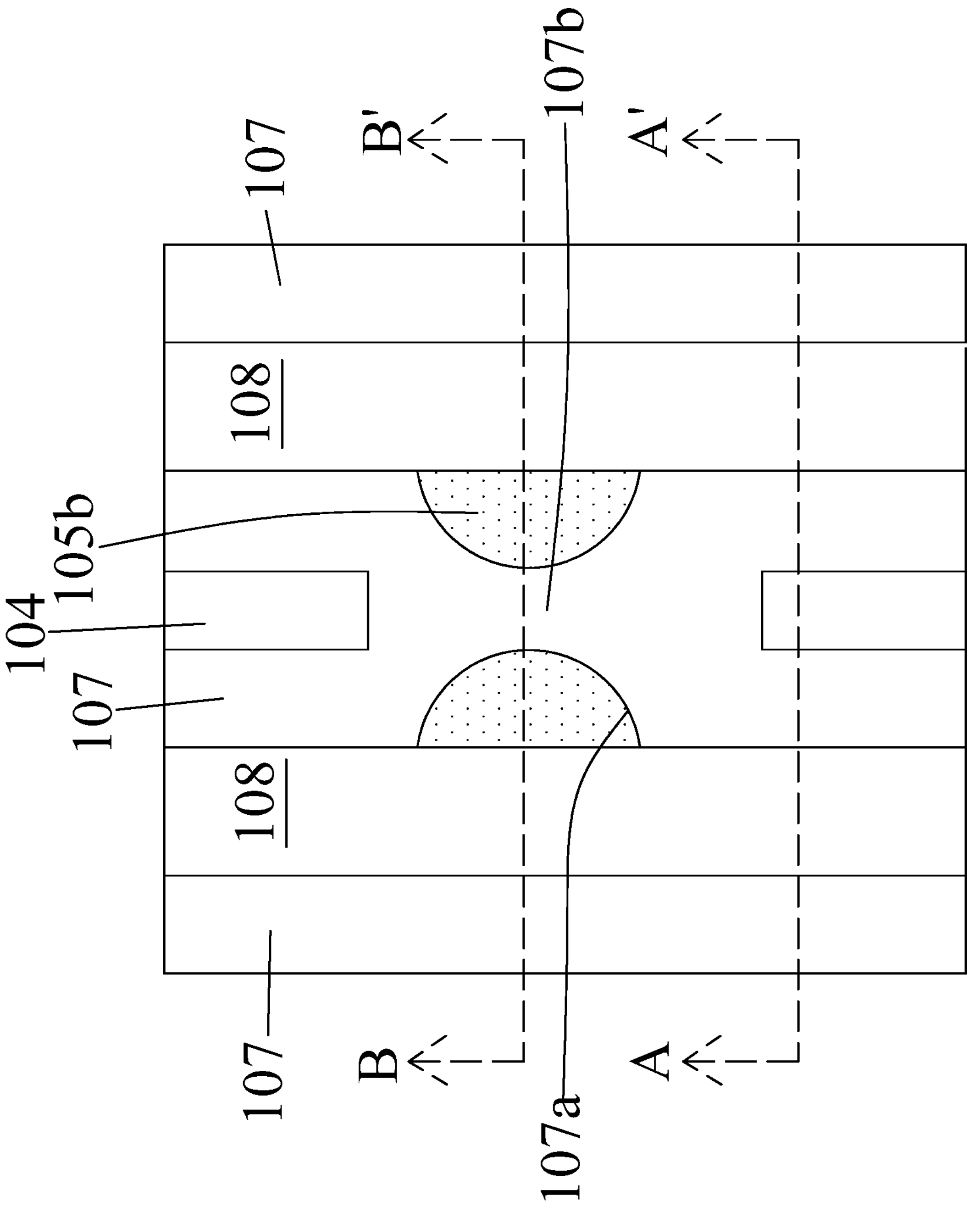
Figure 21:
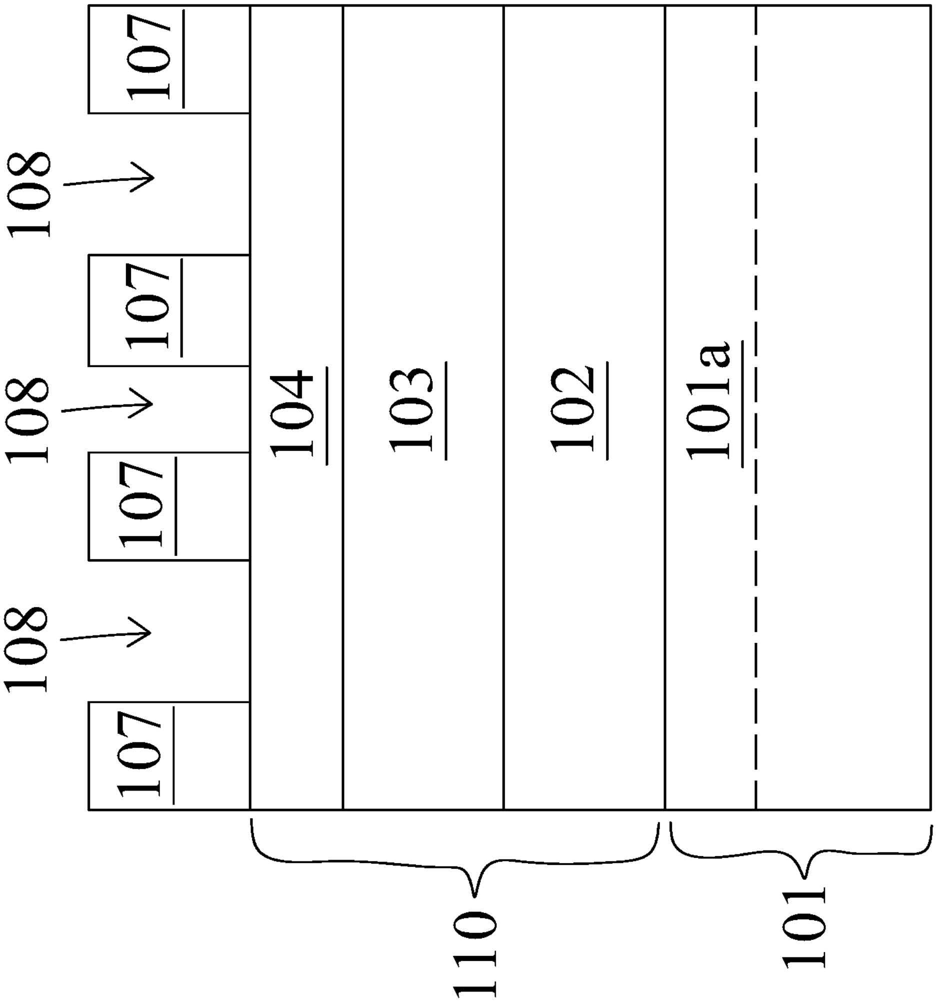
Figure 22:
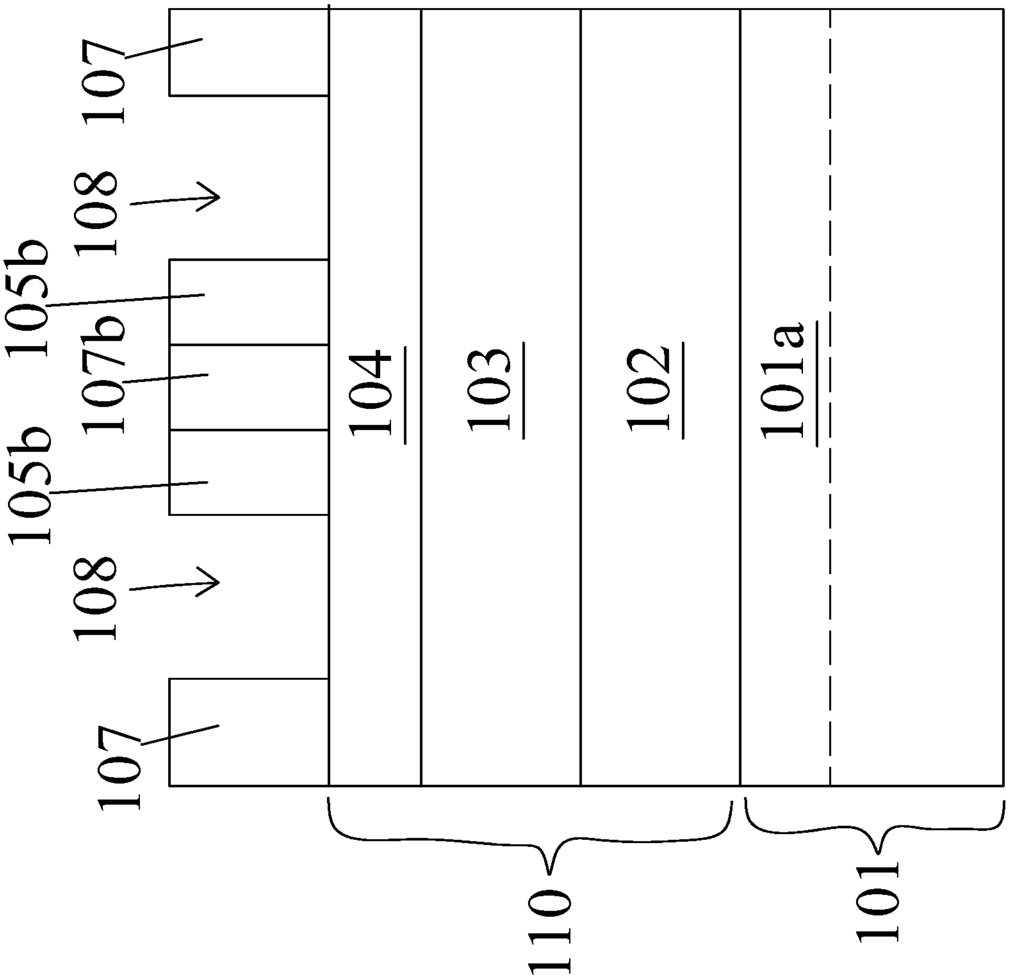

Referring to FIGS. 20 to 22, the strip portion 105*a* of the core 105 is removed according to step S105 in FIG. 1. In some embodiments, the strip portion 105*a* is removed by etching or any other suitable process. In some embodiments, after the removal of the strip portion 105*a* of the core 105, a first slot 108 is formed as shown in FIG. 21.

In some embodiments, the first slot 108 is surrounded by the spacer 107. In some embodiments, the first slot 108 extends vertically over the semiconductor substrate 101. In some embodiments, after the removal of the strip portion 105*a* of the core 105, the protruding portion 105*b* of the core 105 is surrounded by the spacer 107 as shown in FIG. 20.

Figure 23:
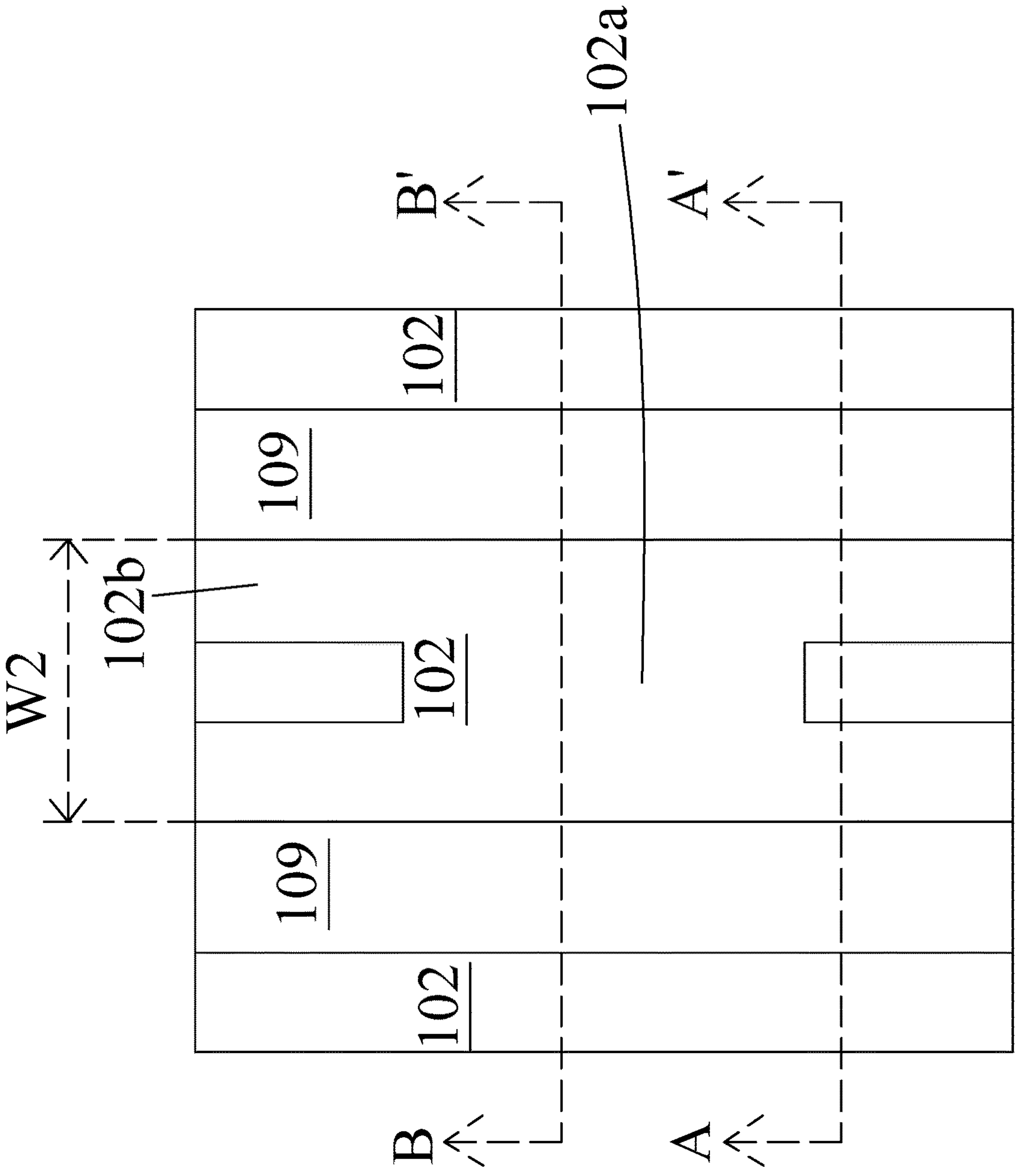
Figure 24:
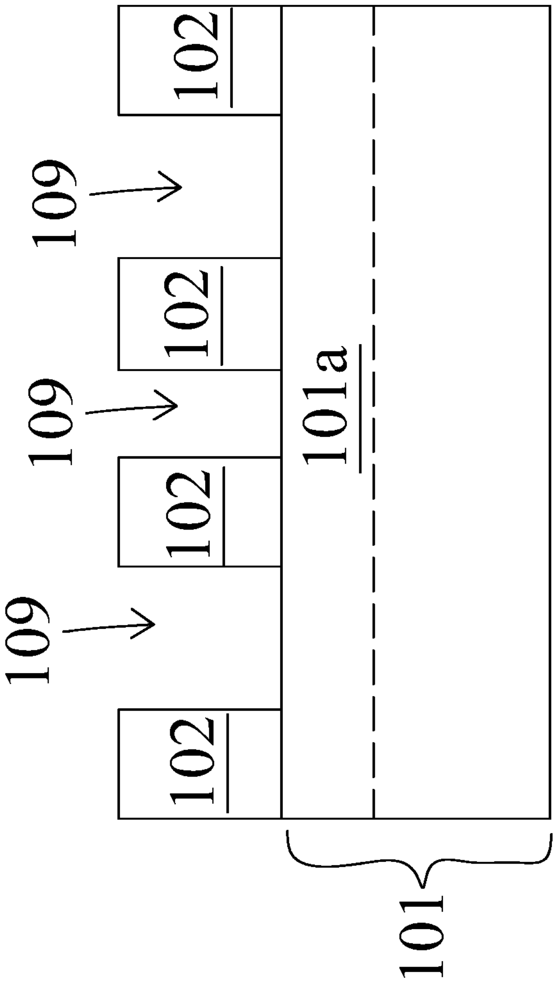
Figure 25:
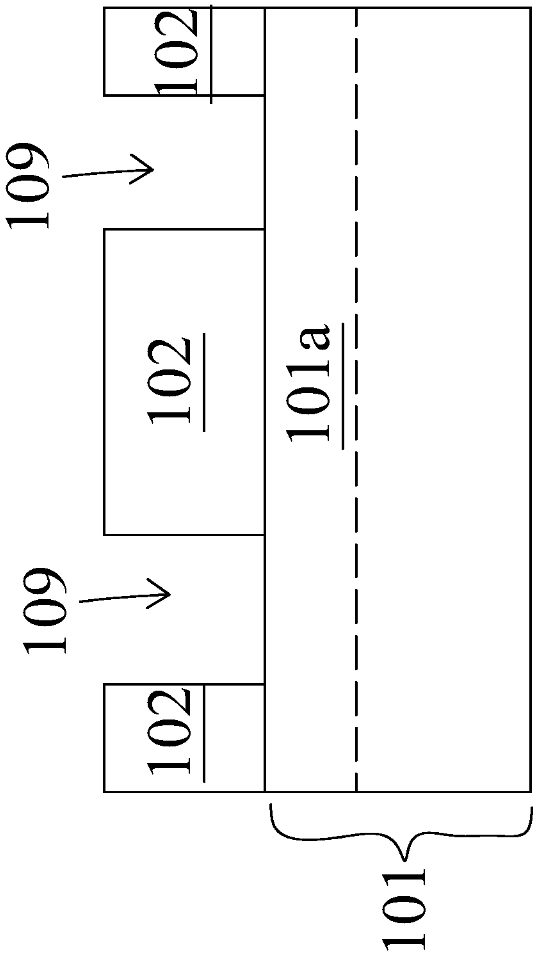

Referring to FIGS. 23 to 25, several portions of the first hard mask 102 exposed through the spacer 107 and the protruding portion 105*b* of the core 105 are removed according to step S106 in FIG. 1. In some embodiments, the portions of the first hard mask 102 are removed by etching or any other suitable process. In some embodiments, several portions of the additional hard mask 103 exposed through the spacer 107 and the protruding portion 105*b* of the core 105 are also removed, prior to the removal of the portions of the first hard mask 102.

In some embodiments, after the removal of the portions of the first hard mask 102, a second slot 109 surrounded by residual portions of the first hard mask 102 is formed. In some embodiments, the second slot 109 extends vertically over the semiconductor substrate 101. In some embodiments, the second slot 109 corresponds to the first slot 108 surrounded by the spacer 107 and formed after the removal of the strip portion 105*a* of the core 105.

In some embodiments, after the removal of the portions of the first hard mask 102 exposed through the spacer 107 and the protruding portions 105*b* of the core 105, the first hard mask 102 includes a bridging portion 102*a* extending laterally between two of strip portions 102*b* of the first hard mask 102. In some embodiments, the bridging portion 102*a* is coupled with two of the strip portions 102*b*. In some embodiments, the strip portions 102*b* extend vertically over the semiconductor substrate 101. In some embodiments, a width W1 of the bridging portion 107*b* as shown in FIG. 17 is substantially less than a width W2 of the bridging portion 102*a* as shown in FIG. 23.

Figure 26:
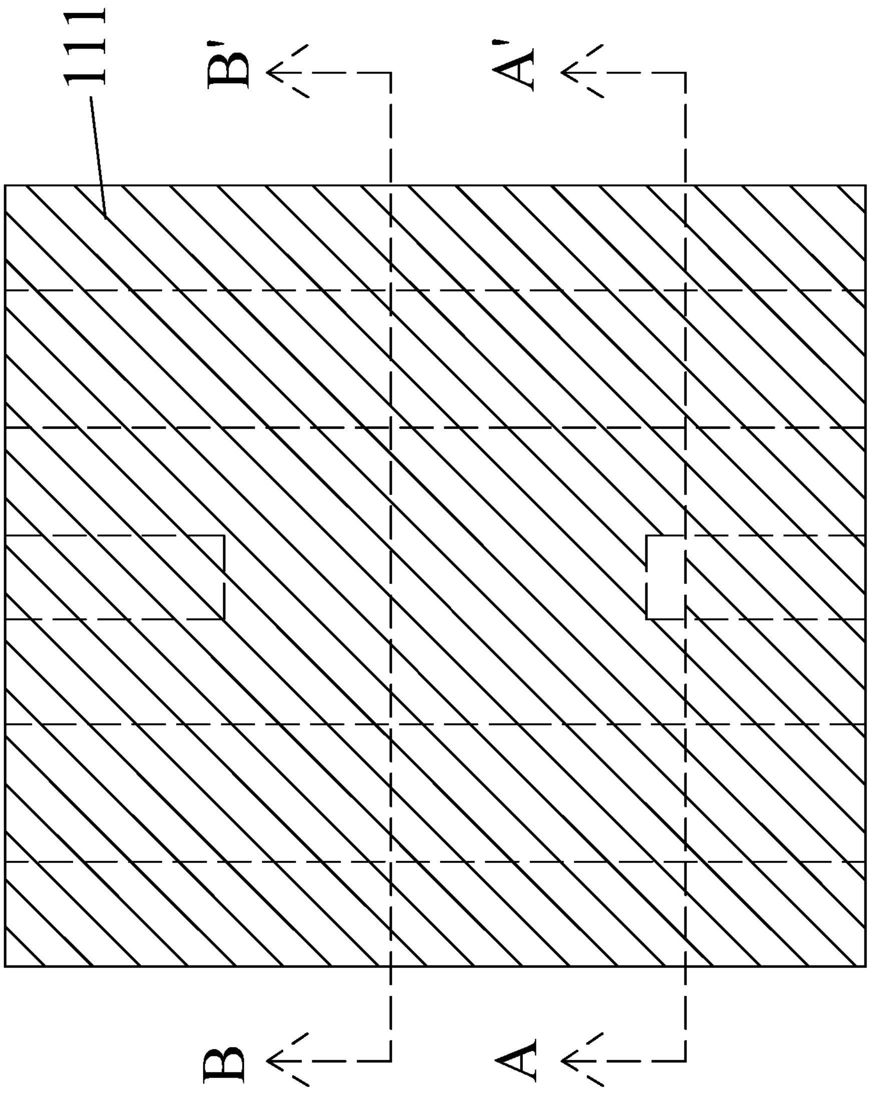
Figure 27:
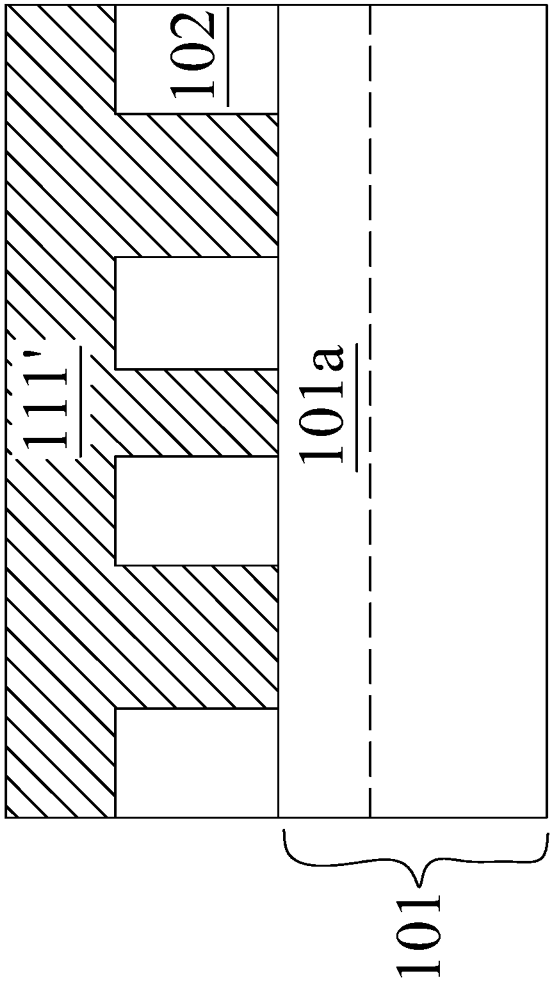
Figure 28:
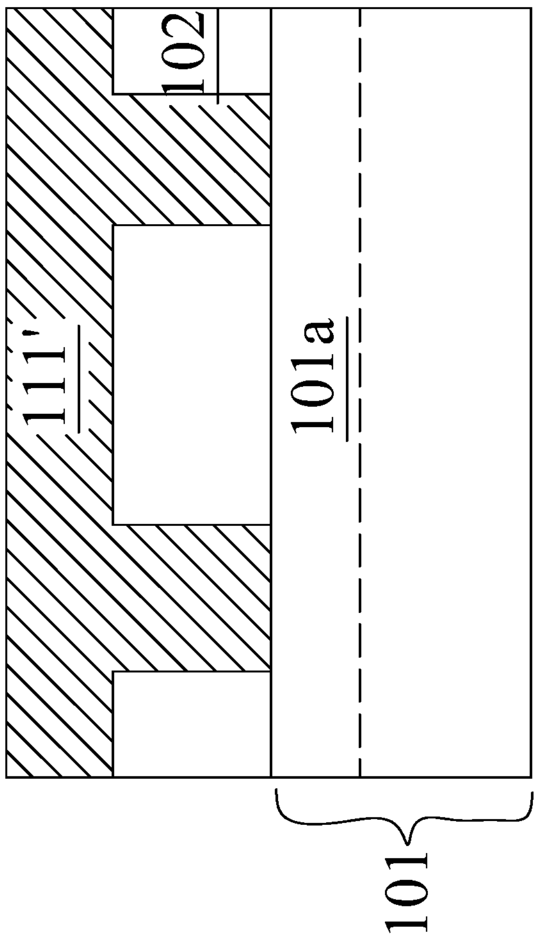

Referring to FIGS. 26 to 31, a second hard mask 111 is formed according to step S107 in FIG. 1. In some embodiments, the second hard mask 111 surrounds the first hard mask 102. In some embodiments, the formation of the second hard mask 111 includes a step of disposing a second hard mask material 111' over the first hard mask 102 and the semiconductor substrate 101 as shown in FIGS. 26 to 28.

In some embodiments, the second hard mask material 111' covers the first hard mask 102 and fills the second slot 109. FIG. 26 illustrates a top cross-sectional view of an intermediate structure after the disposing of the second hard mask material 111'. FIG. 27 illustrates a cross-sectional view of the intermediate structure of FIG. 26 along a line A-A'. FIG. 28 illustrates a cross-sectional view of the intermediate structure of FIG. 26 along a line B-B'.

In some embodiments, the second hard mask material 111' is disposed by physical vapor deposition (PVD), chemical vapor deposition (CVD), spin coating or any other suitable process. In some embodiments, the second hard mask material 111' includes dielectric materials such as oxide, nitride, carbide or the like. In some embodiments, the second hard mask material 111' includes silicon oxide, silicon nitride, silicon carbide or the like. In some embodiments, a first etch rate of the first hard mask 102 relative to an etchant is substantially different from a second etch rate of the second hard mask 111 relative to the etchant.

In some embodiments, the first etch rate of the first hard mask 102 relative to the etchant is substantially greater than the second etch rate of the second hard mask 111 relative to the etchant. In some embodiments, the first etch rate of the first hard mask 102 relative to the etchant is substantially less than the second etch rate of the second hard mask 111 relative to the etchant.

Figure 29:
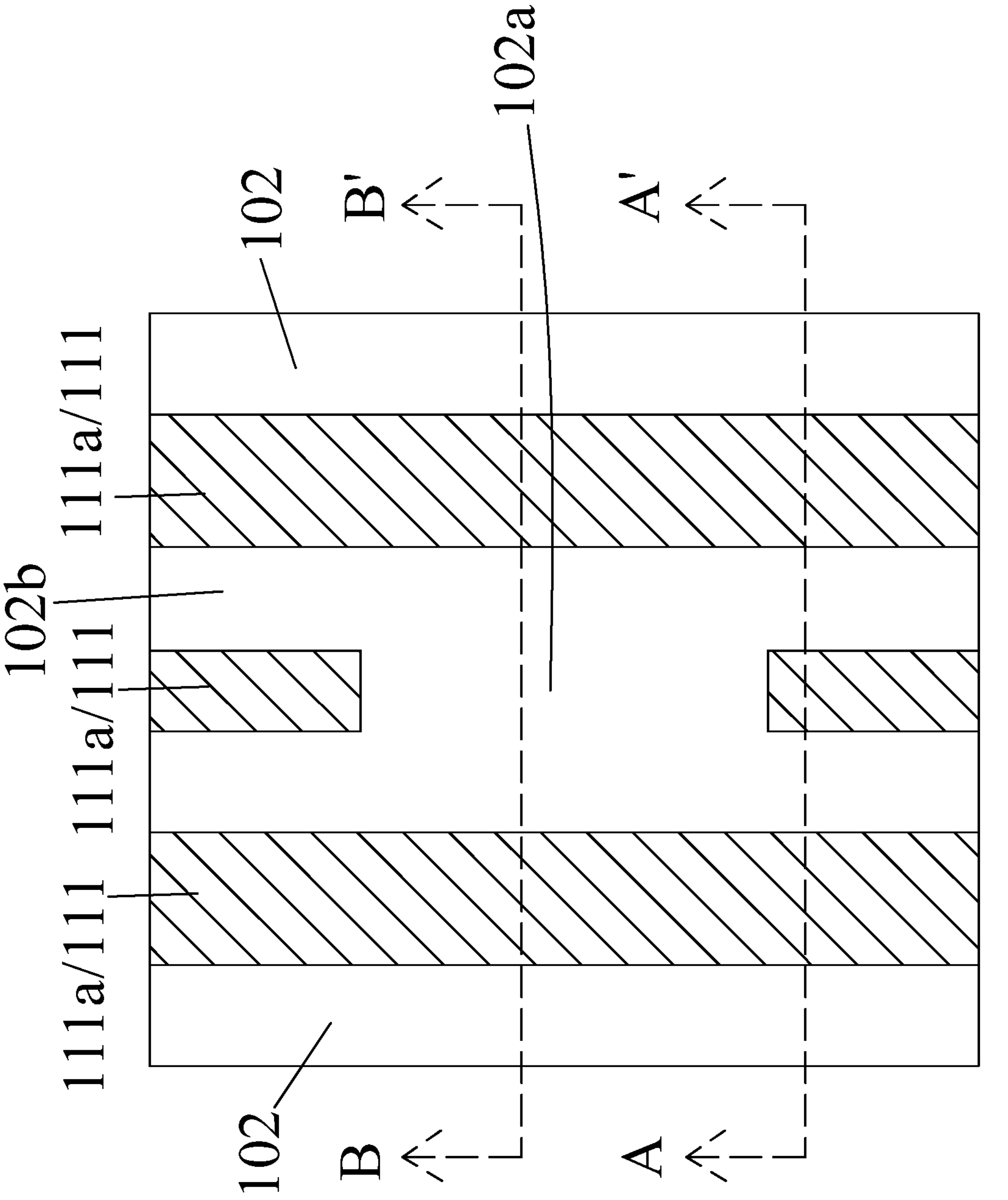
Figure 30:
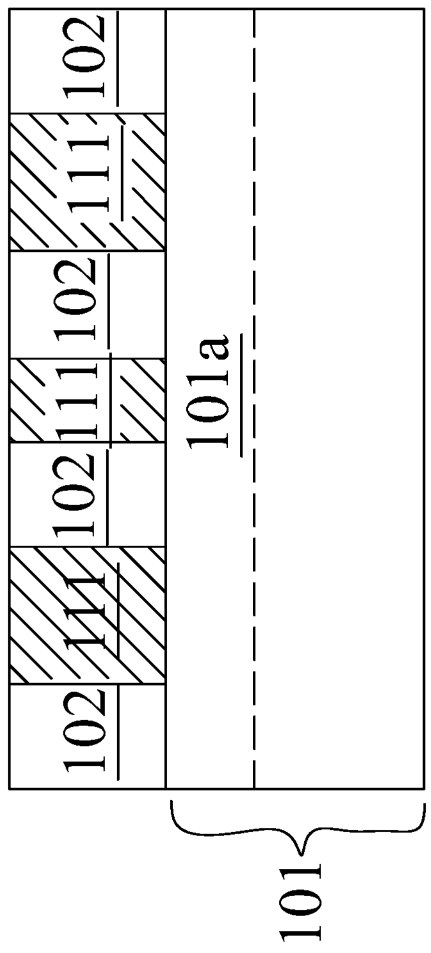
Figure 31:
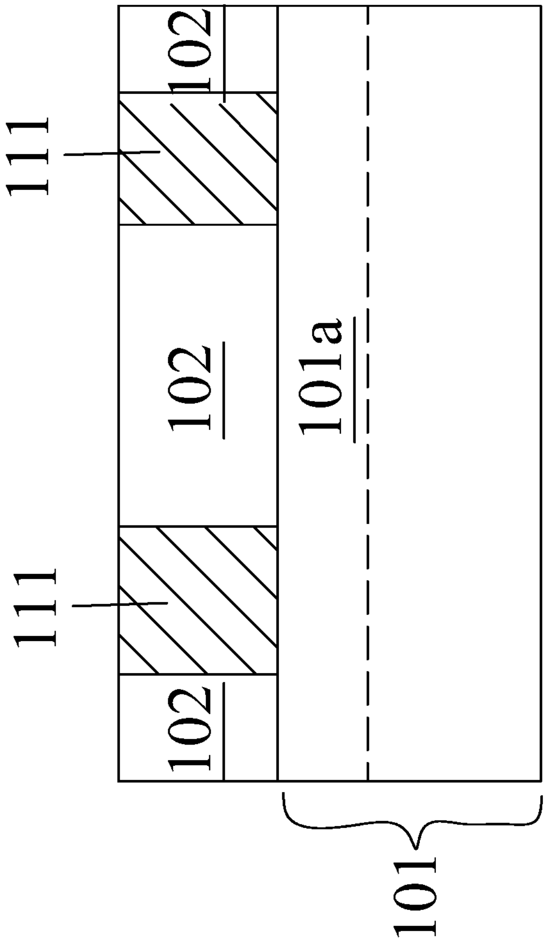

In some embodiments, the second hard mask 111 is formed and surrounded by the first hard mask 102. In some embodiments, the formation of the second hard mask 111 includes a step of planarizing the second hard mask material 111' after the disposing of the second hard mask material 111' as shown in FIGS. 29 to 31. In some embodiments, a top portion of the second hard mask material 111' is removed until a portion of the first hard mask 102 is exposed through the second hard mask material 111'.

In some embodiments, after the formation of the second hard mask 111, the second hard mask 111 includes several strips 111*a* extending parallel to each other as shown in FIG. 29. In some embodiments, the strips 111*a* are separated from each other. In some embodiments, the second slots 109 correspond to the strips 111*a* respectively. In some embodiments, the strips 111*a* have a same length.

Figure 32:
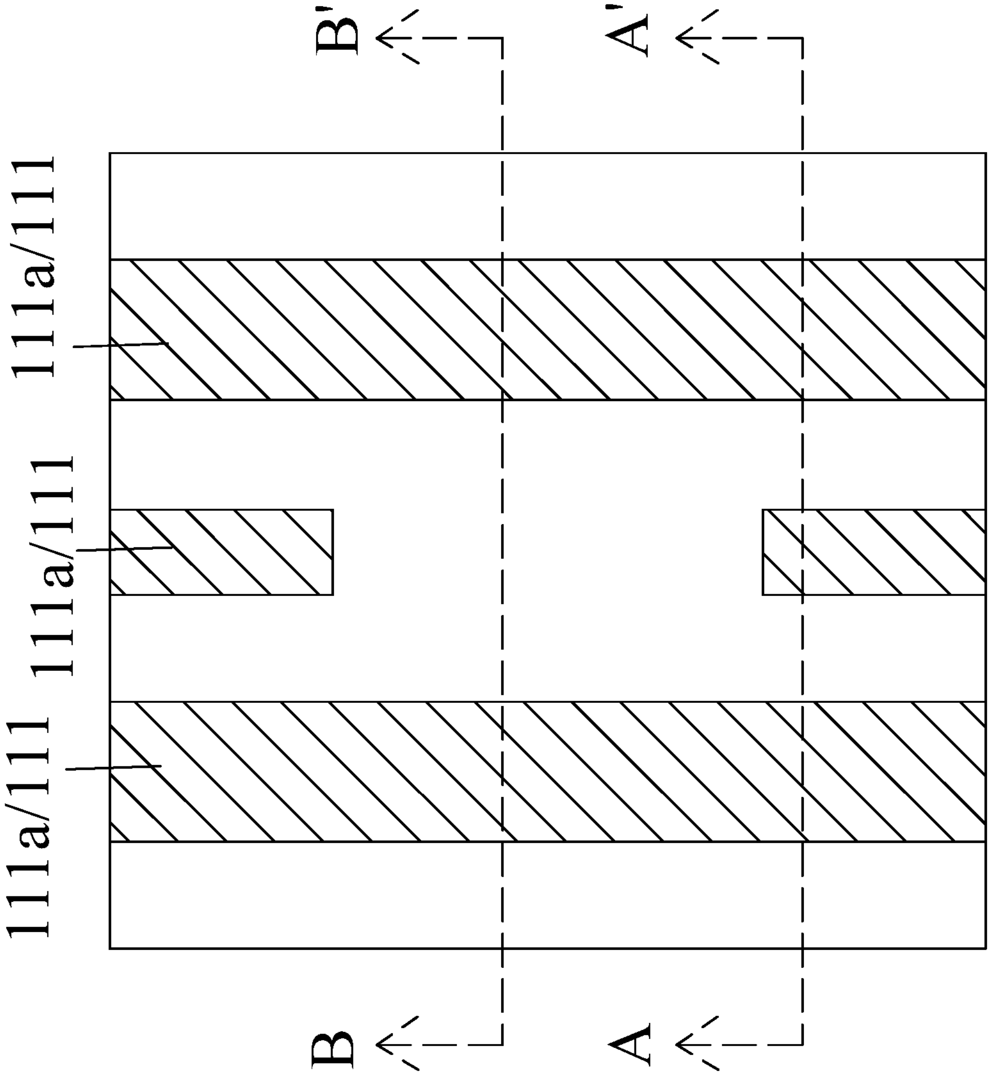
Figure 33:
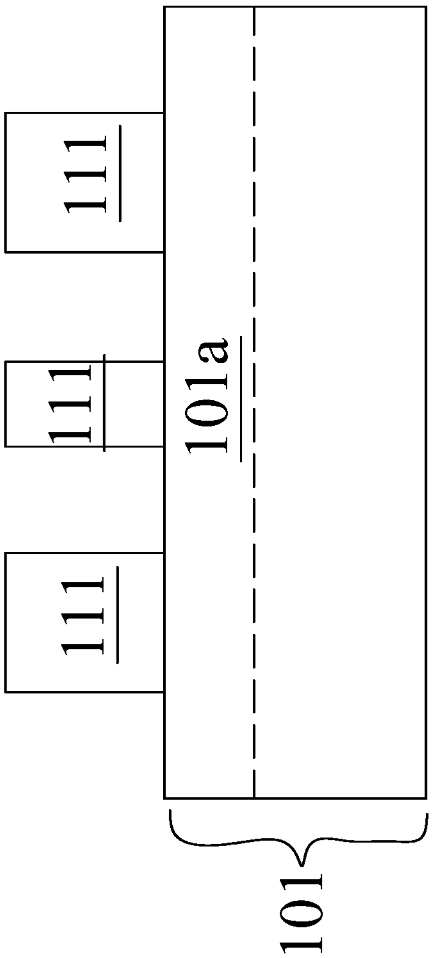
Figure 34:
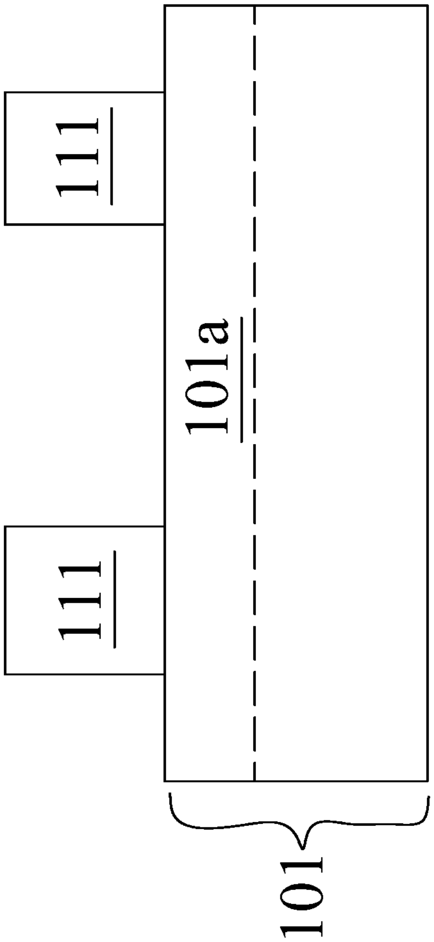

Referring to FIGS. 32 to 34, the first hard mask 102 is removed according to step S108 in FIG. 1. FIG. 32 illustrates a top cross-sectional view of an intermediate structure after the removal of the first hard mask 102. FIG. 33 illustrates a cross-sectional view of the intermediate structure of FIG. 32 along a line A-A'. FIG. 34 illustrates a cross-sectional view of the intermediate structure of FIG. 32 along a line B-B'. In some embodiments, the second hard mask 111 remains over the semiconductor substrate 101. In some embodiments, after the removal of the first hard mask 102, the semiconductor substrate 101 is at least partially exposed through the second hard mask 111.

Figure 35:
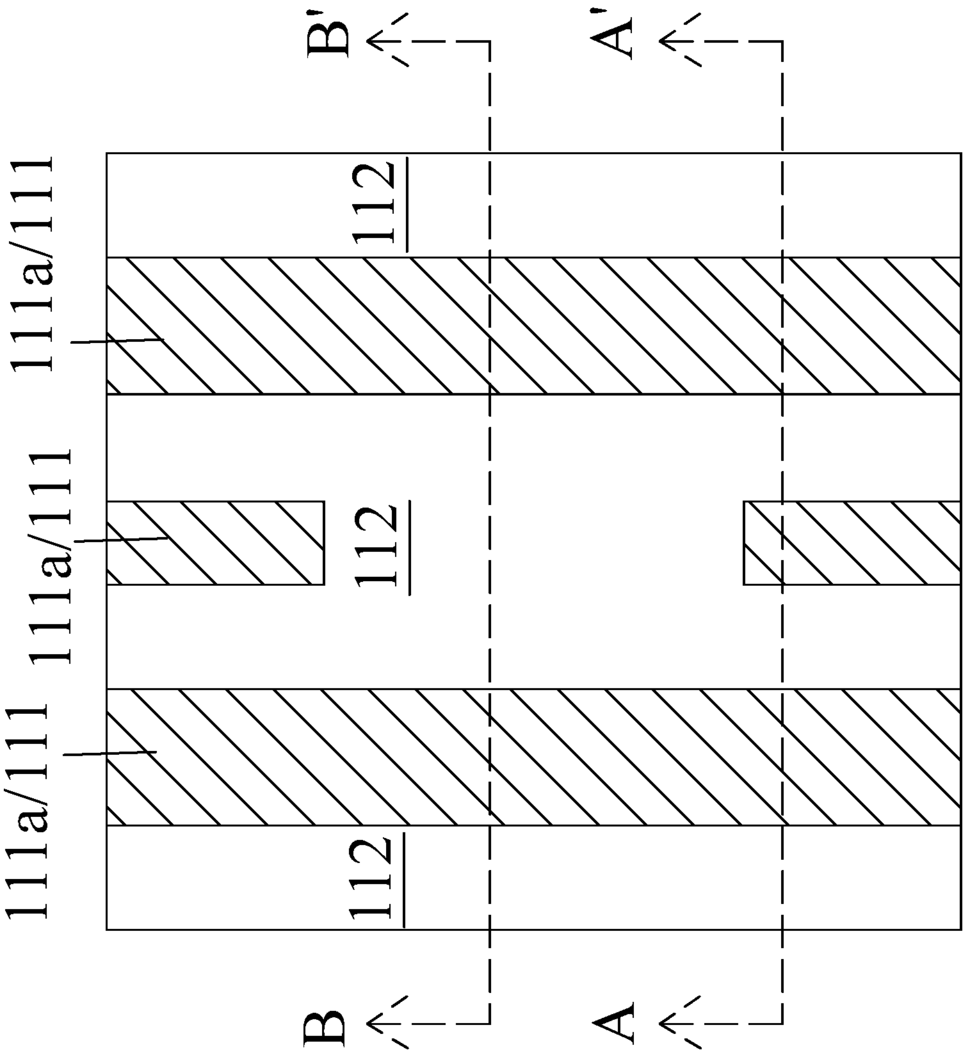
Figure 36:
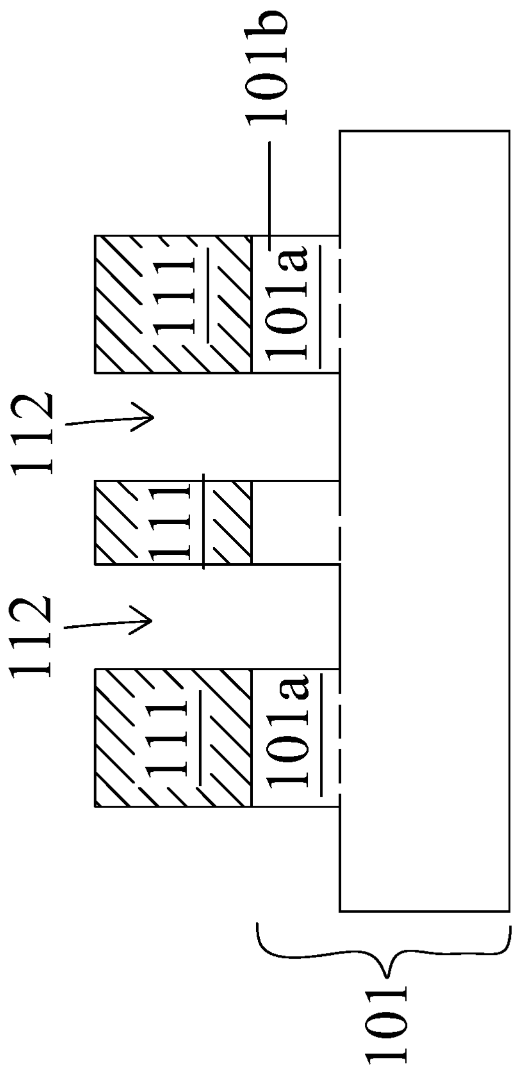
Figure 37:
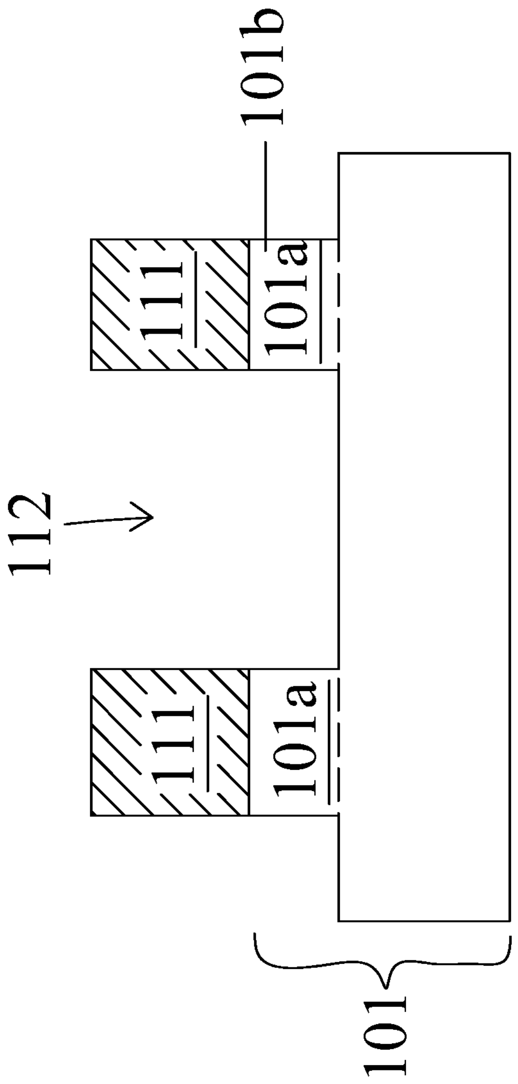

Referring to FIGS. 35 to 37, several portions of the semiconductor substrate 101 are removed according to step S109 in FIG. 1. In some embodiments, the portions of the semiconductor substrate 101 exposed through the second hard mask 111 are removed to form a trench 112. In some embodiments, the trench 112 surrounds at least one of the active areas 101*a* over the semiconductor substrate 101.

Figure 38:
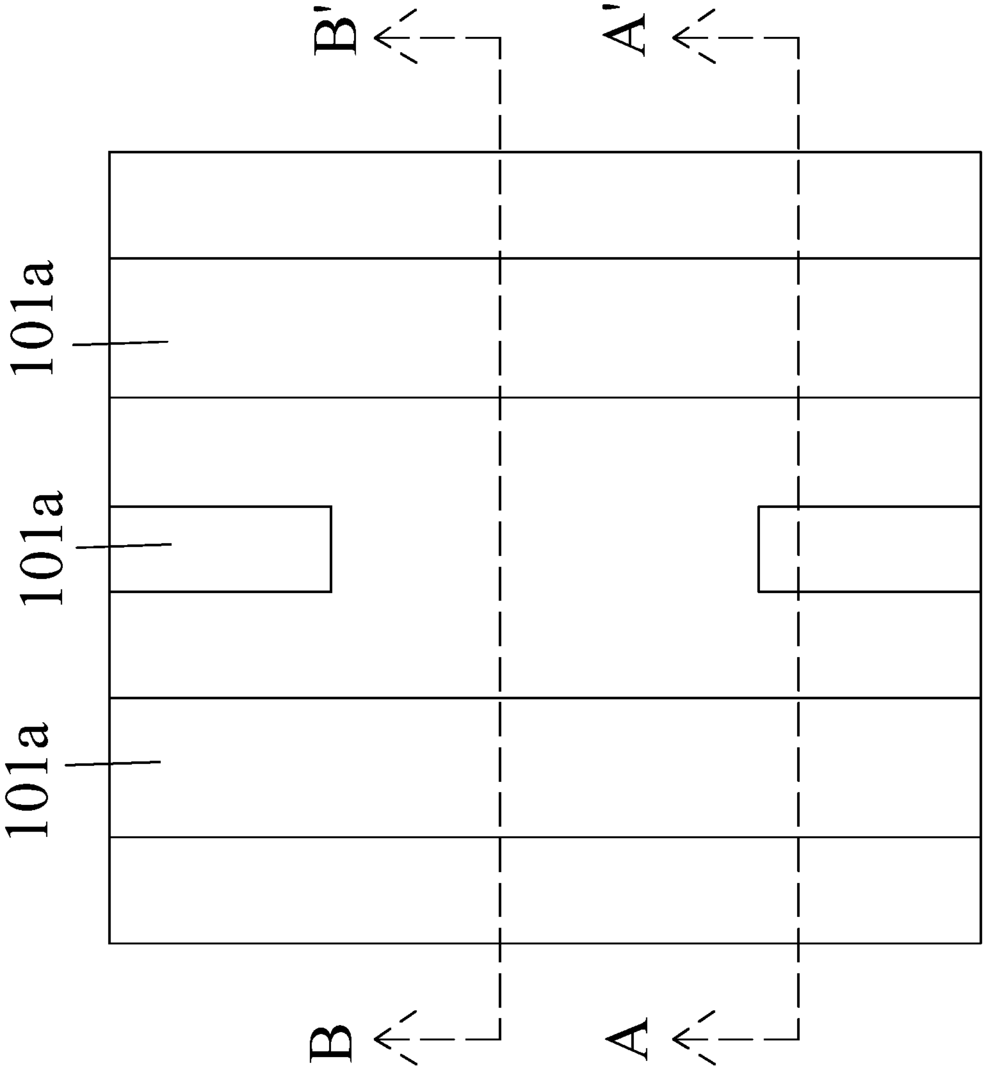
Figure 39:
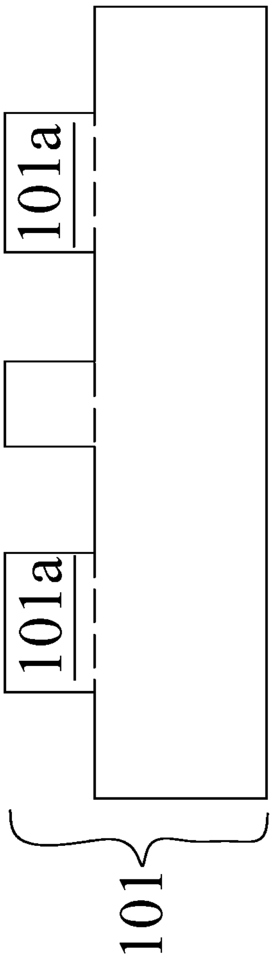
Figure 40:
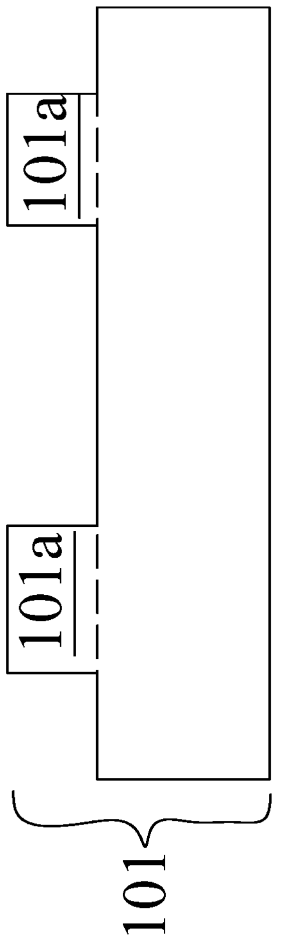

FIG. 35 illustrates a top cross-sectional view of an intermediate structure after the formation of the trench 112. FIG. 36 illustrates a cross-sectional view of the intermediate structure of FIG. along a line A-A'. FIG. 37 illustrates a cross-sectional view of the intermediate structure of FIG. 35 along a line B-B'. In some embodiments, several fins 101*b* protruding from the semiconductor substrate 101 are formed after the formation of the trenches 112. In some embodiments, the fins 101*b* are separated from each other. In some embodiments, after the formation of the trench 112, the second hard mask 111 is removed as shown in FIGS. 38 to 40.

Figure 41:
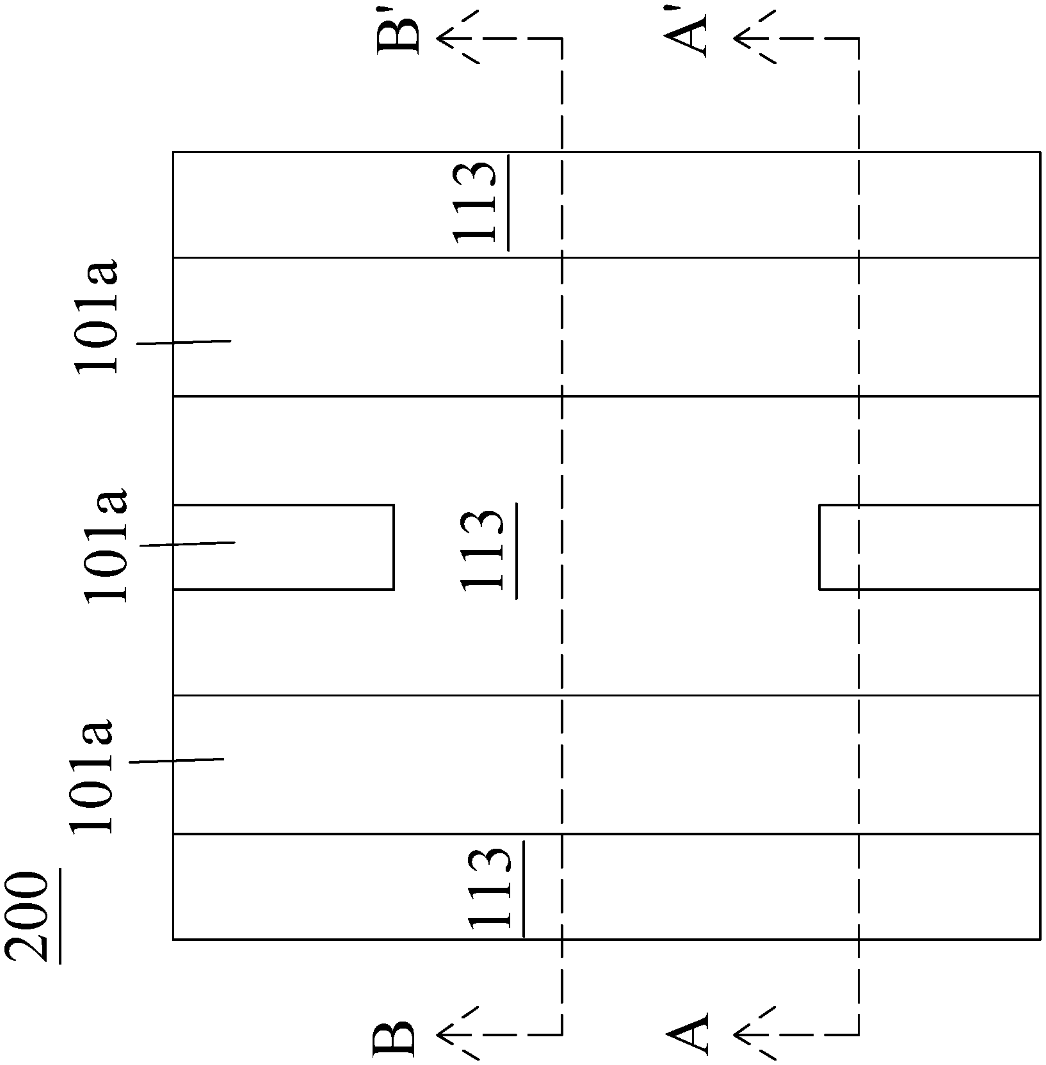
Figure 42:
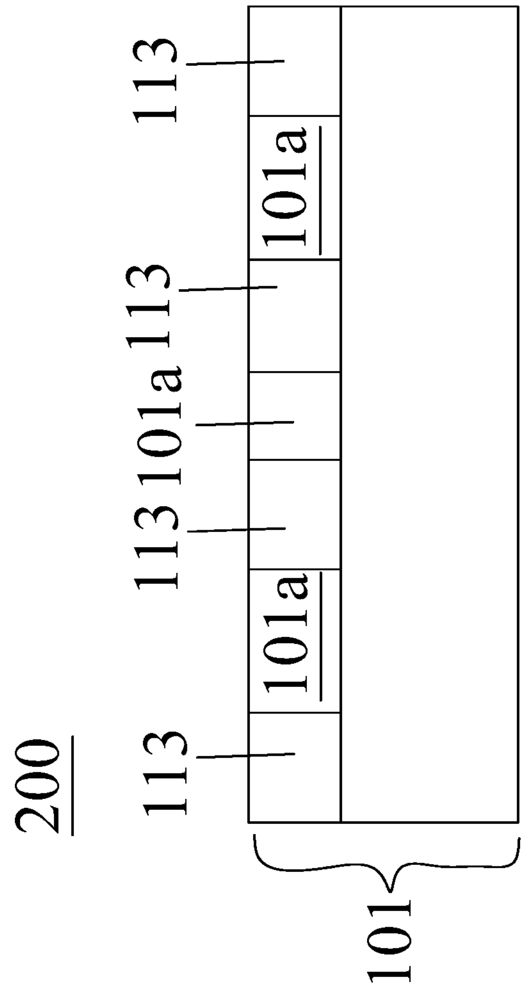
Figure 43:
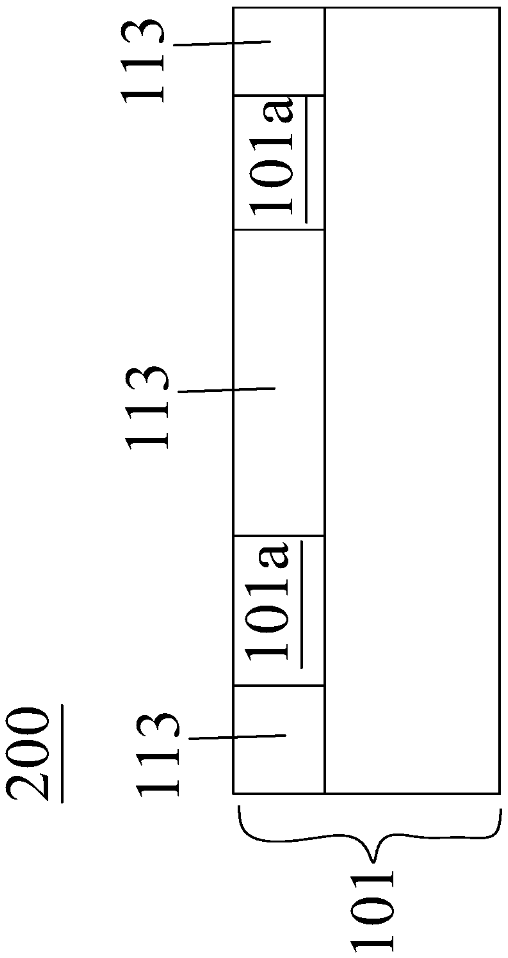

In some embodiments, after the removal of the second hard mask 111, a shallow trench isolation (STI) 113 is formed to separate the active areas 101*a* from each other as shown in FIGS. 41 to 43. In some embodiments, the formation of the shallow trench isolation 113 includes filling the trench 112 with dielectric materials to surround the active area 101*a*.

In some embodiments, the shallow trench isolation 113 is formed by disposing an isolation material between the active areas 101*a* or between the fins 101*b* as shown in FIGS. 41 to 43. In some embodiments, the shallow trench isolation 113 includes oxide or the like. In some embodiments, dimensions of top cross sections of the active areas 101*a* can be same as or different from each other.

In some embodiments, each of the active areas 101*a* includes a same type of dopant. In some embodiments, each of the active areas 101*a* includes a type of dopant that is different from the types of dopants included in other active areas 101*a*. In some embodiments, each of the active areas 101*a* has a same conductive type. In some embodiments, the active area 101*a* includes N type dopants.

In some embodiments, the active area 101*a* is formed by an ion implantation process or an ion doping process. In some embodiments, a memory device 200 as shown in FIGS. 41 to 43 is formed. In some embodiments, the memory device 200 includes several unit cells arranged along rows and columns.

In an aspect of the present disclosure, a method of manufacturing a memory device is provided. The method includes steps of providing a semiconductor substrate defined with an active area disposed over or in the semiconductor substrate; forming a first hard mask over the semiconductor substrate; forming a core over the first hard mask, wherein the core has a strip portion and a protruding portion protruding laterally from the strip portion; forming a spacer surrounding the core; removing the strip portion of the core; removing portions of the first hard mask exposed through the spacer and the protruding portion of the core; forming a second hard mask surrounding the first hard mask; removing the first hard mask; and removing portions of the semiconductor substrate exposed through the second hard mask to form a trench surrounding the active area.

In another aspect of the present disclosure, a method of manufacturing a memory device is provided. The method includes steps of providing a semiconductor substrate defined with an active area disposed over or in the semiconductor substrate; forming a first hard mask over the semiconductor substrate, wherein the first hard mask includes a plurality of slots; forming a second hard mask surrounding the first hard mask and disposed within the plurality of slots, wherein the second hard mask includes a plurality of strips extending parallel to each other; removing the first hard mask; and removing portions of the semiconductor substrate exposed through the second hard mask to form a plurality of trenches surrounding the active area.

In another aspect of the present disclosure, a method of manufacturing a memory device is provided. The method includes steps of providing a semiconductor substrate defined with an active area disposed over or in the semiconductor substrate; forming a first hard mask over the semiconductor substrate; forming a core over the first hard mask, wherein the core has a plurality of first strip portions and a plurality of protruding portions protruding laterally from a corresponding one of the plurality of the first strip portions; forming a spacer surrounding the core, wherein the spacer includes a first bridging portion extending laterally between two of the plurality of protruding portions; removing the plurality of first strip portions of the core; removing portions of the first hard mask exposed through the spacer and the plurality of protruding portions of the core; forming a second hard mask surrounding the first hard mask; removing the first hard mask; and removing portions of the semiconductor substrate exposed through the second hard mask to form a trench surrounding the active area.

In conclusion, because an active area over or in a memory device can be defined by disposing an additional hard mask pattern instead of partially removing or modifying another hard mask pattern, a total number of photomasks required for defining the active area can be reduced. Therefore, misalignment among the memory cells in the memory device can be prevented or minimized. As a result, an overall performance of the memory device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:

providing a semiconductor substrate defined with an active area disposed over or in the semiconductor substrate;

forming a first hard mask over the semiconductor substrate;

forming a core over the first hard mask, wherein the core has a plurality of first strip portions and a plurality of protruding portions protruding laterally from a corresponding one of the plurality of the first strip portions;

forming a spacer surrounding the core, wherein the spacer includes a first bridging portion extending laterally between two of the plurality of protruding portions;

removing the plurality of first strip portions of the core;

removing portions of the first hard mask exposed through the spacer and the plurality of protruding portions of the core;

forming a second hard mask surrounding the first hard mask;

removing the first hard mask; and removing portions of the semiconductor substrate exposed through the second hard mask to form a trench surrounding the active area.

2. The method according to claim 1, wherein the first bridging portion of the spacer further includes a region disposed between two of the plurality of first strip portions of the core.

3. The method according to claim 1, wherein after the formation of the spacer, the spacer has a recess laterally indented into the first bridging portion of the spacer.

4. The method according to claim 3, wherein the first bridging portion of the spacer is conformal to the recess of the spacer.

5. The method according to claim 1, wherein the second hard mask is formed by disposing a second hard mask material over the first hard mask, and planarizing the second hard mask material to expose the first hard mask.

6. The method according to claim 1, wherein after the removal of the portions of the first hard mask exposed through the spacer and the plurality of protruding portions of the core, the first hard mask includes a second bridging portion extending laterally between two of a plurality of second strip portions of the first hard mask.

7. The method according to claim 6, wherein a width of the first bridging portion is less than a width of the second bridging portion.

8. The method according to claim 1, wherein a first etch rate of the first hard mask relative to an etchant is different from a second etch rate of the second hard mask relative to the etchant.

9. The method according to claim 1, wherein a first etch rate of the first hard mask relative to an etchant is greater than a second etch rate of the second hard mask relative to the etchant.

10. The method according to claim 1, wherein a first etch rate of the first hard mask relative to an etchant is less than a second etch rate of the second hard mask relative to the etchant.

11. The method according to claim 1, wherein the second hard mask includes a plurality of strips separated from each other.

12. The method according to claim 11, wherein the plurality of strips are parallel to each other.

13. The method according to claim 11, wherein the plurality of strips have a same length.

14. The method according to claim 1, wherein the core includes photoresist material.

15. The method according to claim 1, wherein the spacer includes nitride.

* * * * *